(12) United States Patent
Chung et al.

(10) Patent No.: US 7,232,719 B2
(45) Date of Patent: Jun. 19, 2007

(54) MEMORIES HAVING A CHARGE STORAGE NODE AT LEAST PARTIALLY LOCATED IN A TRENCH IN A SEMICONDUCTOR SUBSTRATE AND ELECTRICALLY COUPLED TO A SOURCE/DRAIN REGION FORMED IN THE SUBSTRATE

(75) Inventors: Chao-Hsi Chung, Jhibei (TW); Jung-Wu Chien, Hsinchu (TW)

(73) Assignee: ProMOS Technologies Inc., Hsin Chu (TW)

( * ) Notice: Subject to any disclaimer, the term of this patent is extended or adjusted under 35 U.S.C. 154(b) by 0 days.

(21) Appl. No.: 11/092,150

(22) Filed: Mar. 28, 2005

(65) Prior Publication Data

US 2006/0216889 A1   Sep. 28, 2006

(51) Int. Cl.
*H01L 21/8242* (2006.01)
(52) U.S. Cl. ............... 438/243; 438/239; 438/242; 257/296; 257/298; 257/301; 257/E29.346
(58) Field of Classification Search ............ 257/301, 257/E27.091, 296, 298, E29.346; 438/242, 438/243, 239
See application file for complete search history.

(56) References Cited

U.S. PATENT DOCUMENTS

| | | | | |
|---|---|---|---|---|
| 4,830,978 A | * | 5/1989 | Teng et al. | ............ 438/249 |
| 5,064,777 A | * | 11/1991 | Dhong et al. | ............ 438/242 |
| 5,508,219 A | | 4/1996 | Bronner et al. | |
| 5,519,236 A | * | 5/1996 | Ozaki | ............ 257/302 |
| 5,670,805 A | | 9/1997 | Hammerl et al. | |
| 5,804,851 A | * | 9/1998 | Noguchi et al. | ............ 257/304 |
| 5,977,579 A | | 11/1999 | Noble | |
| 6,190,971 B1 | * | 2/2001 | Gruening et al. | ............ 438/270 |
| 6,426,252 B1 | | 7/2002 | Radens et al. | |

(Continued)

OTHER PUBLICATIONS

U.S. Appl. No. 10/904,479, filed Nov. 12, 2004 entitled, "Deep Trench Capacitor and Method of Fabricating Thereof".

*Primary Examiner*—Thao P. Le
(74) *Attorney, Agent, or Firm*—Michael Shenker; MacPherson Kwok Chen & Heid LLP

(57) ABSTRACT

A memory charge storage node (120.1, 120.2, 120.3) is at least partially located in a trench (124). The memory comprises a transistor including a source/drain region (170) present at a first side (124.1) but not a second side (124.2) of the trench. Before forming conductive material (120.3) providing at least a portion of the charge storage node, a blocking feature (704) is formed adjacent to the second side (124.2) to block the conductive material (120.3). The blocking feature can be dielectric left in the final structure, or can be a sacrificial feature which is removed after the conductive material deposition to make room for dielectric. The blocking features for multiple trenches in a memory array can be patterned using a mask (710) comprising a plurality of straight strips each of which runs through the memory array in the row direction. The charge storage node has a protrusion (120.3) at the first side of the trench adjacent to the source/drain region and also has a top surface portion (T) laterally adjacent to the protrusion. The trench sidewall has a substantially straight portion (S) on the second side (124.2) rising above the top surface portion (T). The dielectric (144.1, 144.2, 188) on the trench sidewall has a portion (188) which is thicker on the second side than on the first side of the trench.

10 Claims, 29 Drawing Sheets

U.S. PATENT DOCUMENTS

| | | |
|---|---|---|
| 6,440,794 B1 | 8/2002 | Kim |
| 6,630,379 B2 * | 10/2003 | Mandelman et al. ....... 438/243 |
| 6,693,041 B2 | 2/2004 | Divakaruni et al. |
| 2004/0129965 A1 | 7/2004 | Chen |
| 2005/0285175 A1 | 12/2005 | Cheng et al. |
| 2006/0118850 A1 * | 6/2006 | Otani et al. .................. 257/301 |

* cited by examiner (I-I')

(I-I')

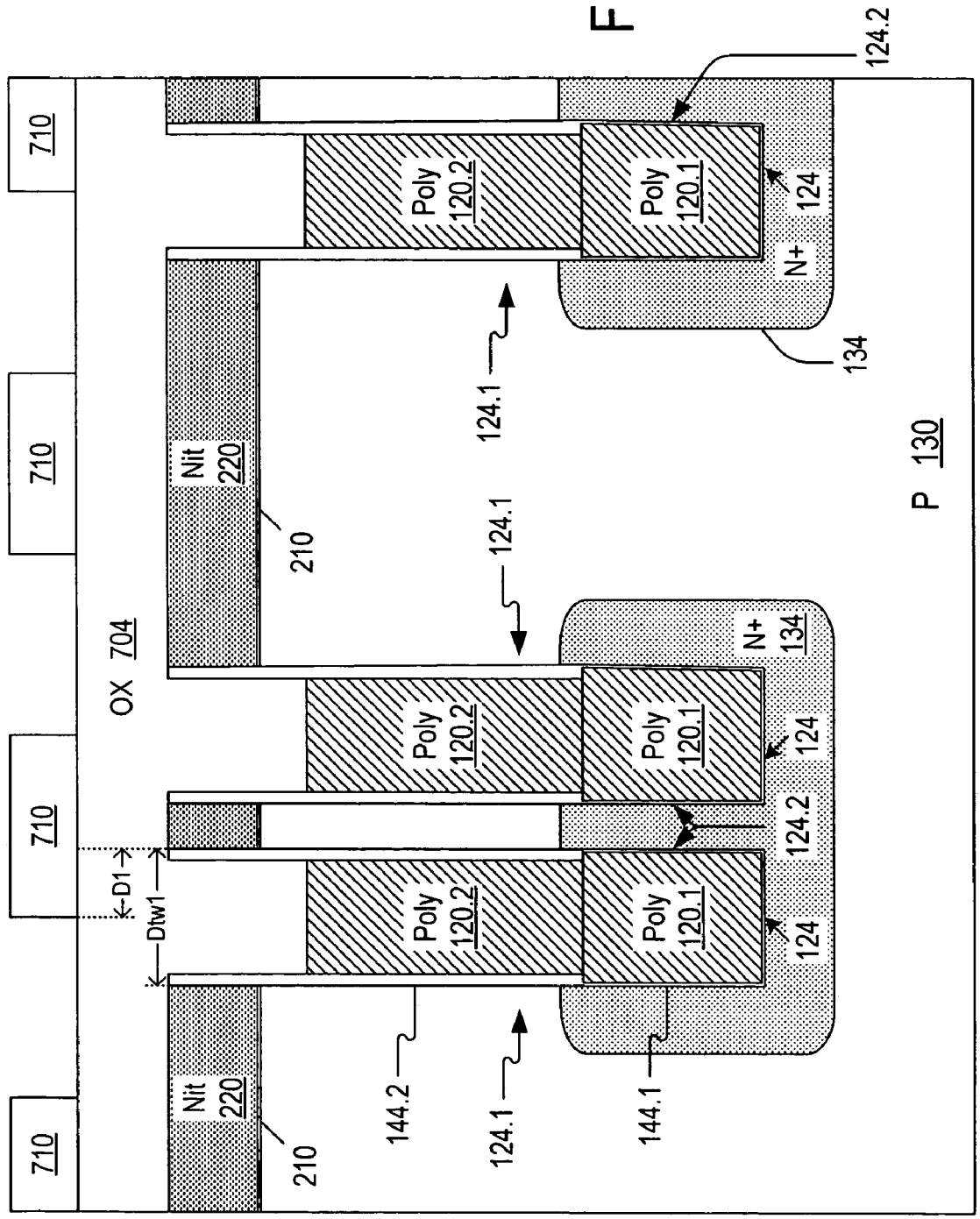

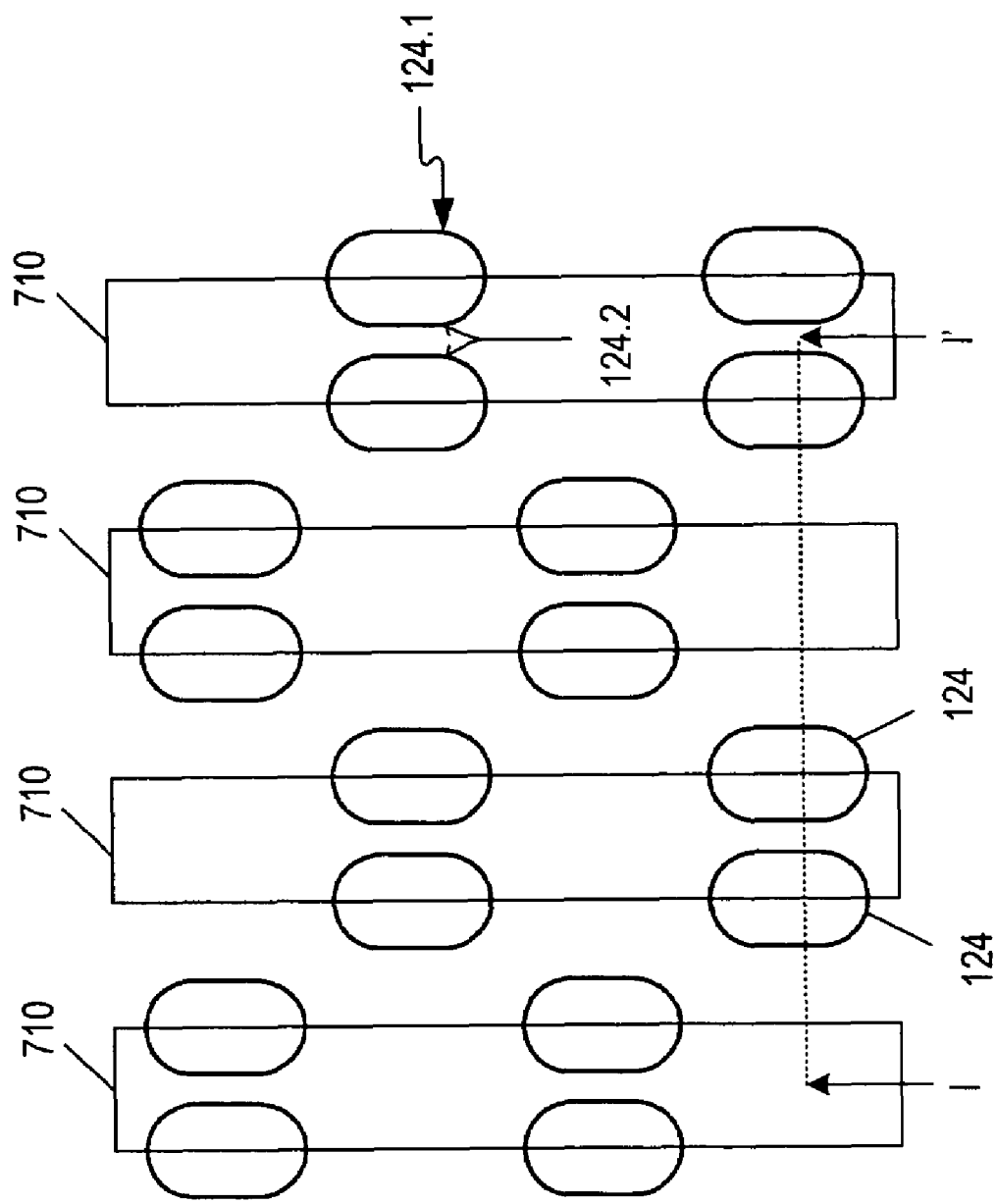

(I-I')

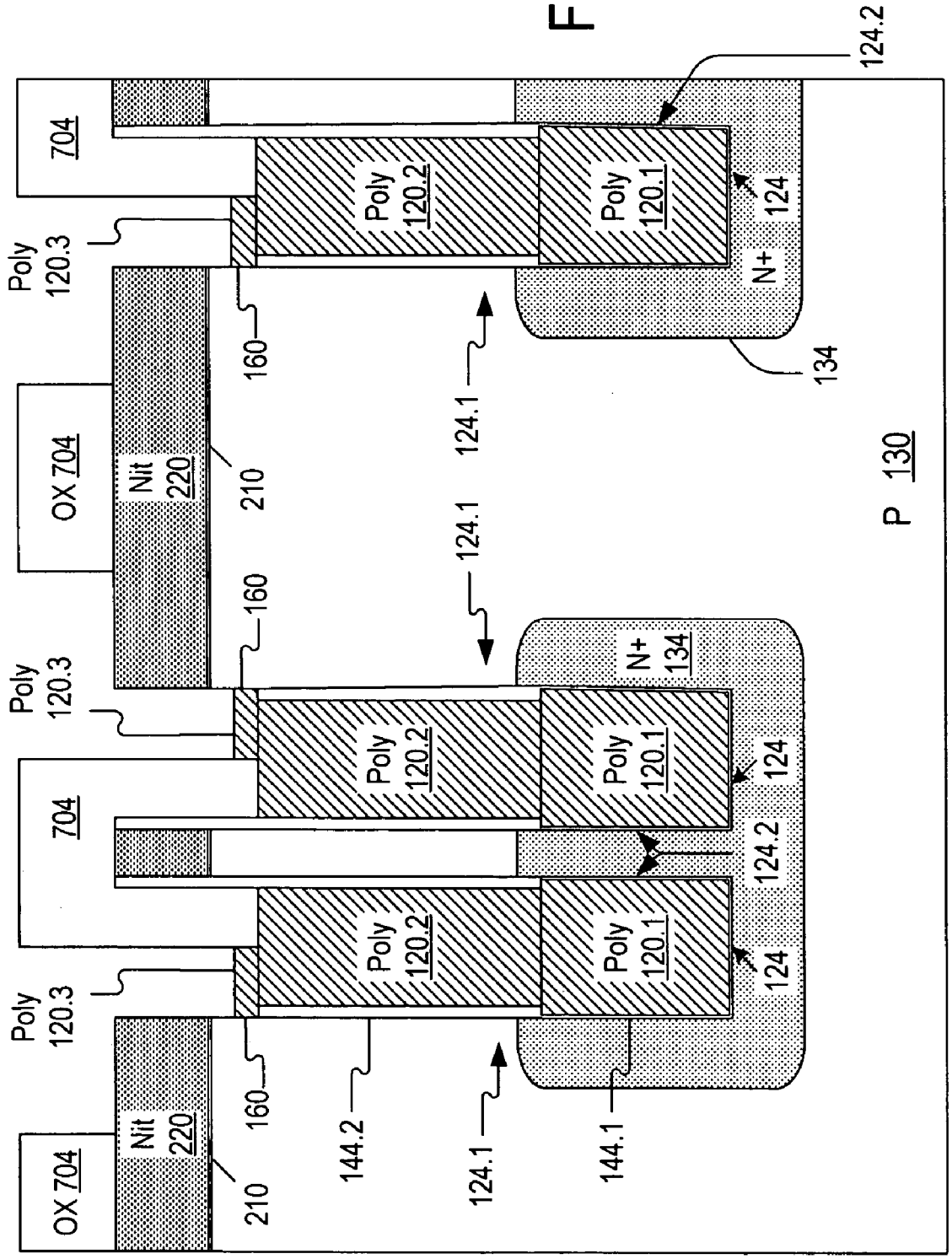
FIG. 9A (I-I')

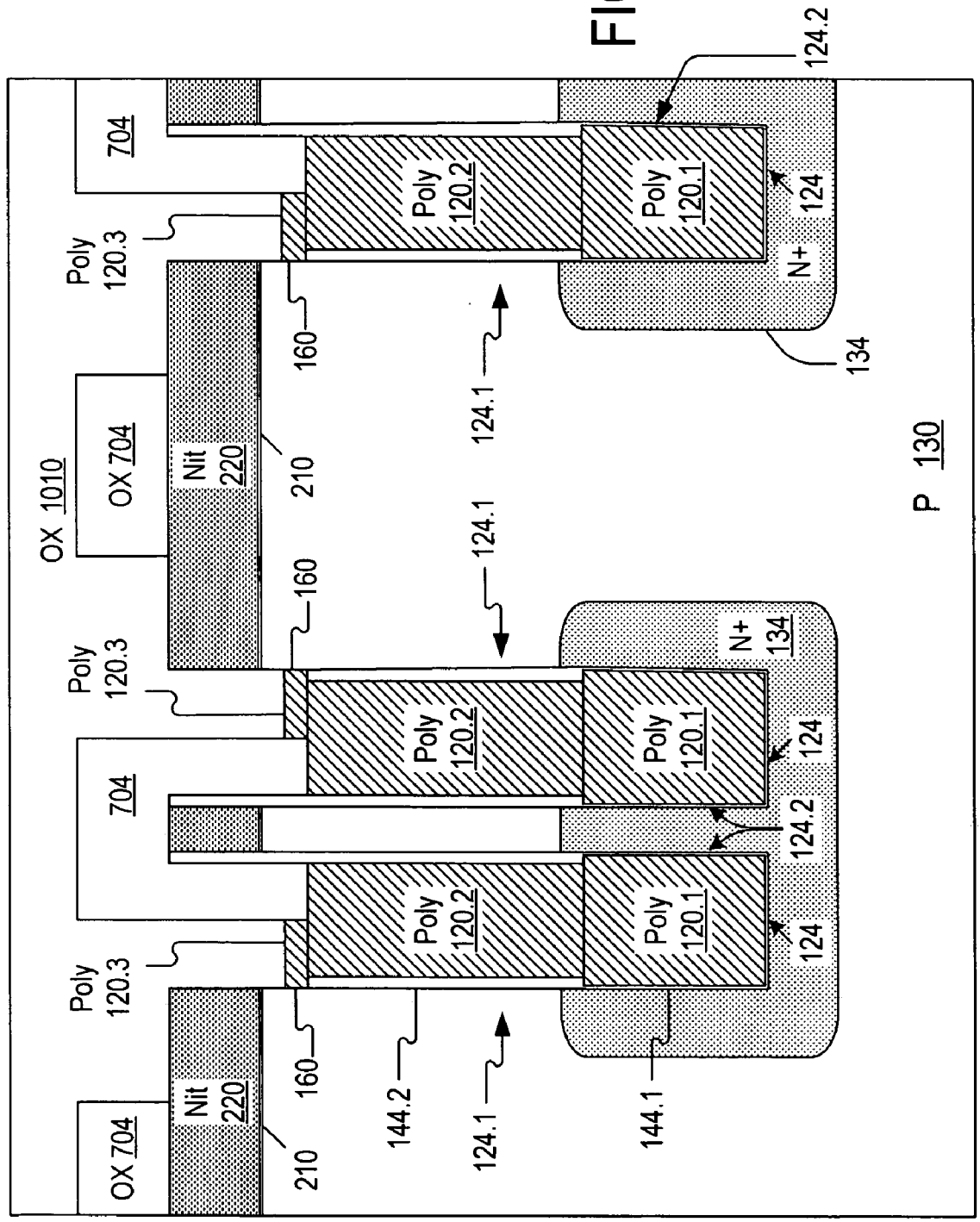

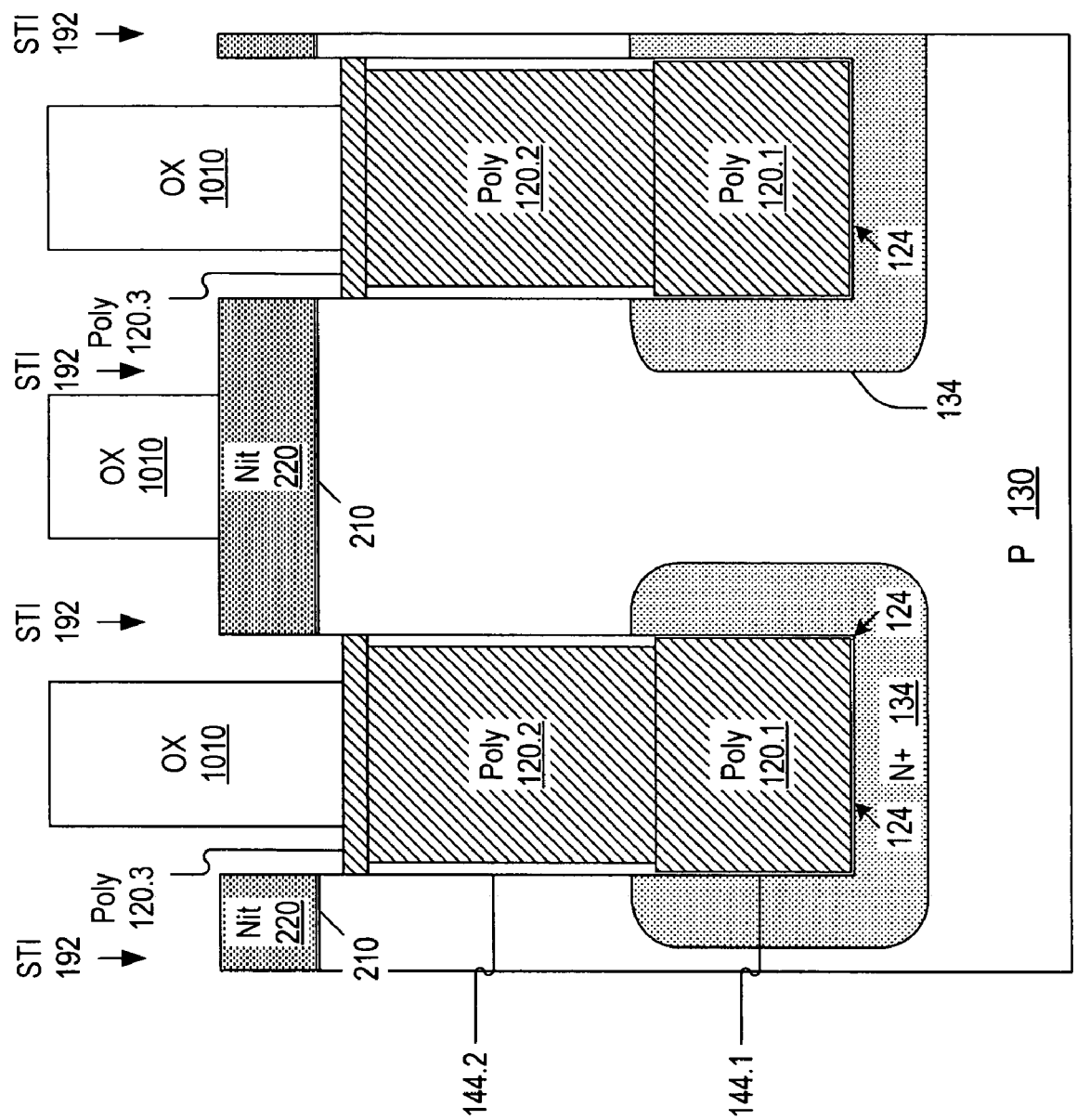
FIG. 10C (II-II')

(III-III')

(II-II')

III-III'

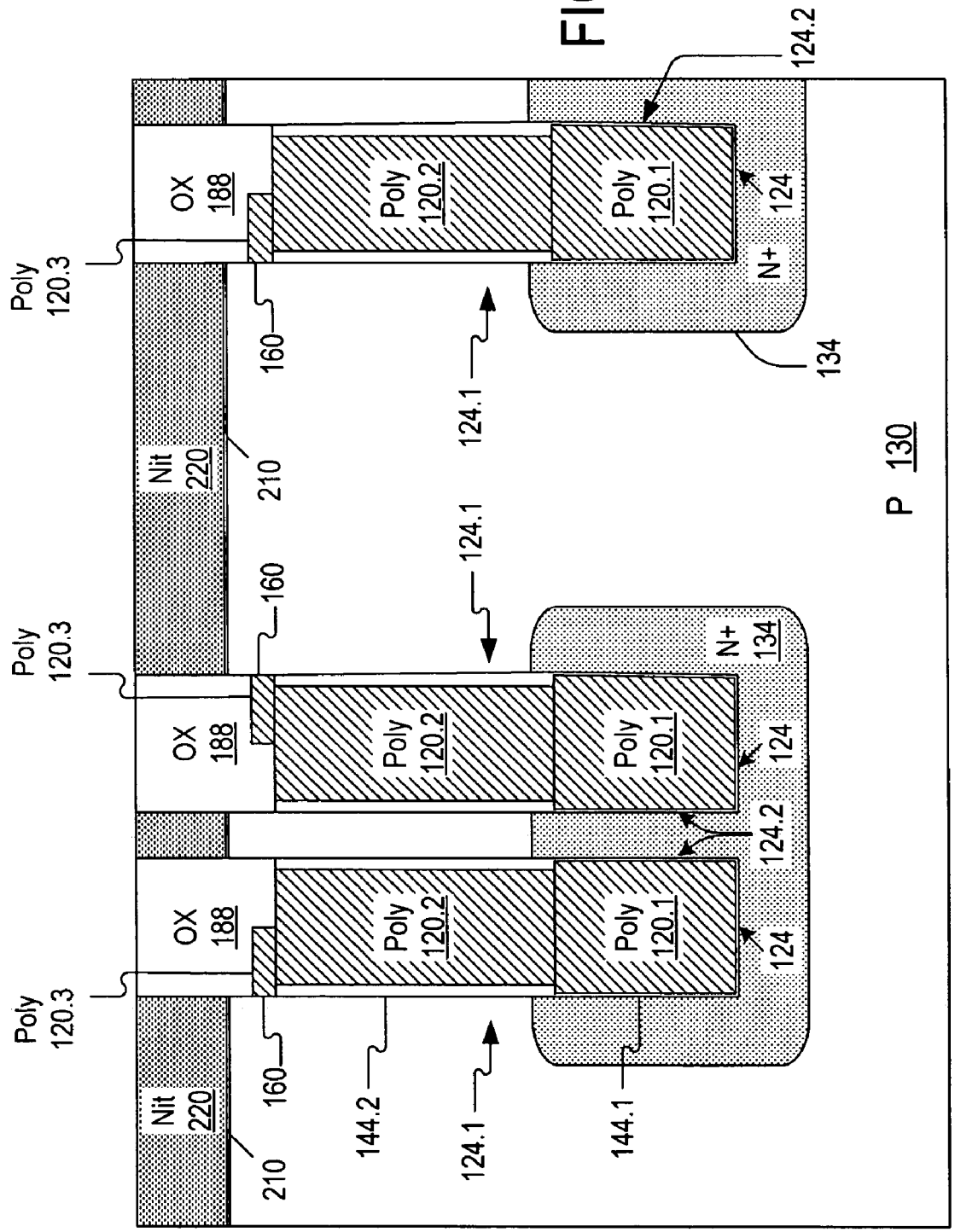
FIG. 12A (I-I')

(II-II')

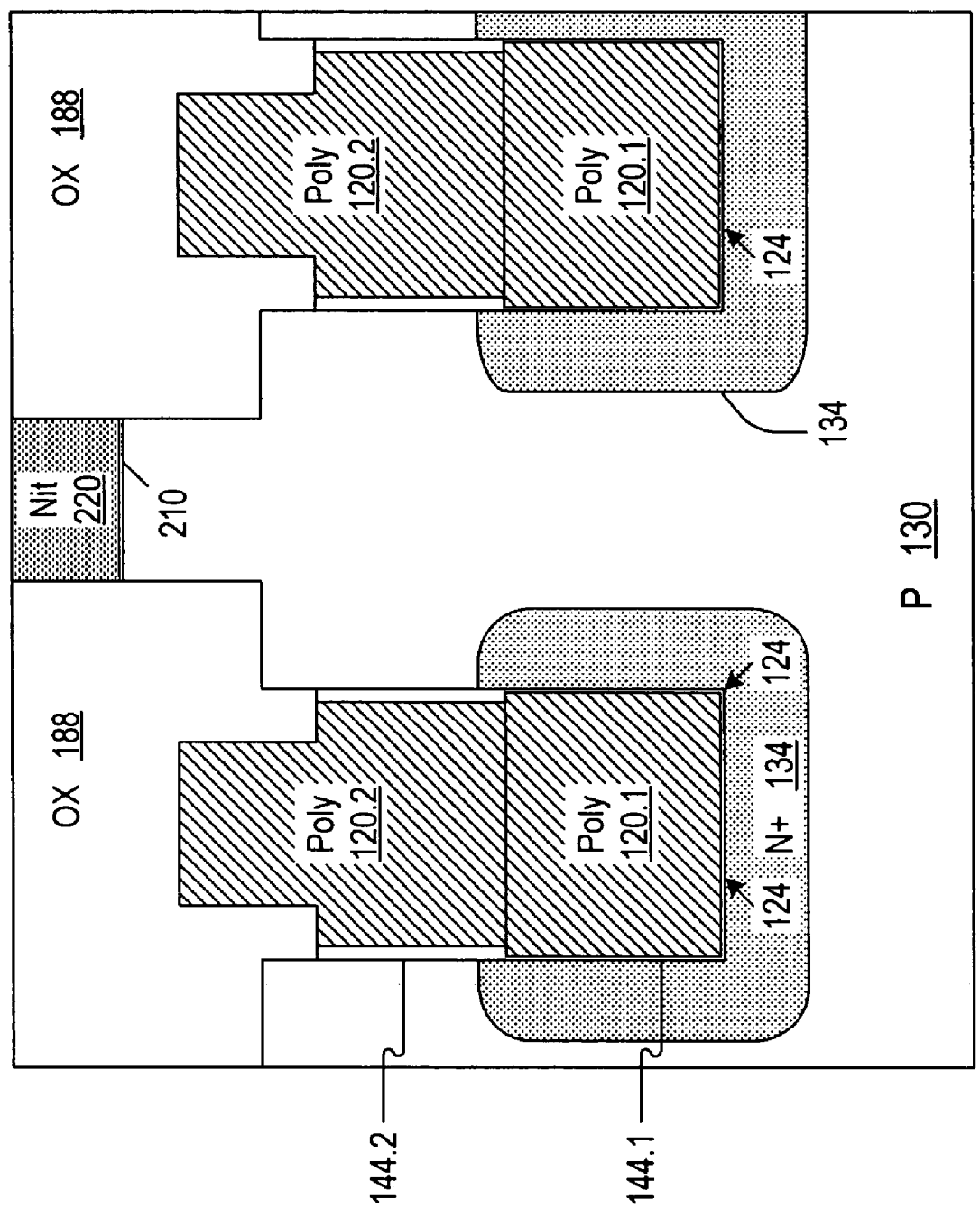
FIG. 12C (III-III')

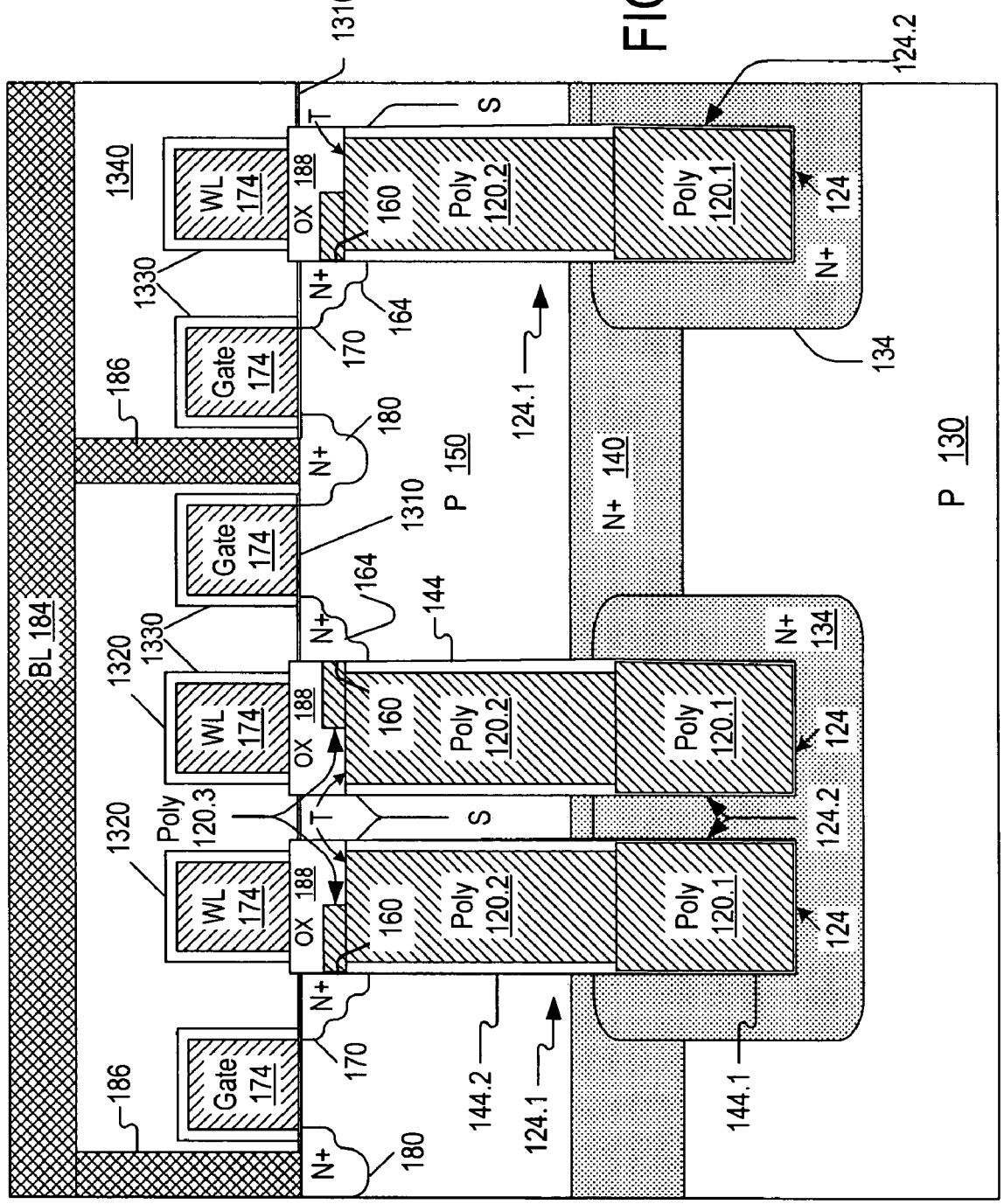
FIG. 13B (I-I')

(II-II')

(III-III')

(I-I')

(I-I')

MEMORIES HAVING A CHARGE STORAGE NODE AT LEAST PARTIALLY LOCATED IN A TRENCH IN A SEMICONDUCTOR SUBSTRATE AND ELECTRICALLY COUPLED TO A SOURCE/DRAIN REGION FORMED IN THE SUBSTRATE

BACKGROUND OF THE INVENTION

The present invention relates to integrated circuits, and more particularly to integrated circuits comprising memories.

FIG. 1A is a top view of a dynamic random access memory array (DRAM array). FIG. 1B shows a planar vertical cross section of the array along a bitline, along a line I-I' in FIG. 1A. Each DRAM cell includes a storage capacitor having a plate 120 formed in a trench 124 in a P type semiconductor substrate 130. The other capacitor plate 134 is a buried N+ region of substrate 130. The capacitor regions 134 are interconnected by an N+ doped band region 140 held at a constant voltage during the memory operation. Dielectric film 144 on the trench surface separates the capacitor plates 120 from N type regions 134, 140 and an overlying P well 150 of substrate 130. Dielectric 144 is removed from the trench sidewall in a contact area 160 in which the capacitor plate 120 physically contacts an N+ doped buried strap region 164 of substrate 130. Buried strap 164 extends from the trench sidewall to a source/drain region 170 of the cell's pass transistor. Pass transistor gates 174 are provided by a polysilicon wordline (FIG. 1A) running through the array. The same numeral 174 is used for the wordlines and the individual gates. The other source/drain region 180 of the pass transistor is connected to a bitline 184 (schematically shown as a straight line in FIG. 1A) by a contact 186 (shown as a dot in FIG. 1A). Region 184 and contact 186 are shared with the pass transistor of the adjacent cell in the same column. The bitlines are connected to sense amplifiers (not shown) as known in the art. See e.g. U.S. Pat. No. 6,440,794 issued on Aug. 27, 2002 to Kim and incorporated herein by reference.

The cells of each column are grouped in pairs. Each trench 124 has sides 124.1, 124.2, with the side 124.2 facing the other cell of the same pair, and the side 124.1 facing away from the other cell of the pair. The cell pairs of each column are shifted relative to the cell pairs of the adjacent columns. In each column, two pass transistors are located between the adjacent cell pairs. Each wordline 174 provides pass transistor gates for alternating columns, and runs over trenches 124 of the remaining columns. Dielectric 188 provides insulation between the trenches 124 in each cell pair at the top of substrate 130 and also helps insulate the capacitor plates 120 from the overlying wordlines 174. Dielectric regions 192 (FIG. 1A) are manufactured with shallow trench isolation technology (STI) to provide substrate isolation between the adjacent memory columns.

FIG. 2 illustrates the memory array cross section at an intermediate fabrication stage. A silicon dioxide layer 210 ("pad oxide") and a silicon nitride layer 220 are formed on substrate 130 and patterned photolithographically to define trenches 124. Substrate 130 is etched to form the trenches 124. Arsenic doped silicon dioxide (also called arsenic doped silicon glass or ASG), not shown, is deposited into the bottom portions of the trenches 124. The structure is heated to diffuse the arsenic into substrate 130 and form the capacitor plates 134. Dielectric 144 and doped polysilicon 120 are formed in the trenches 124. Dielectric 144 has been removed at the top of the trenches 124 and, in particular, in contact areas 160. Therefore, polysilicon 120 physically contacts the silicon substrate at the top of the trenches 124.

A mask 310 (FIG. 3) is formed over the structure to protect the polysilicon 120 near contact areas 160. Nitride 220, oxide 210, polysilicon 120 and substrate 130 are etched through the mask openings to form a region 320 in each pair of the memory cells. Isolation trenches for dielectric regions 192 (FIG. 1A) can be etched in substrate 130 at the same time or in a separate step. Mask 310 is removed, and dielectric 188 (FIG. 4) is deposited and polished to fill the regions 320 and the isolation trenches.

Dielectric 188 is polished down to a desired depth. See FIG. 1B. Oxide 210 and nitride 220 are removed. Band region 140 is formed by ion implantation. Wordlines 174, source/drain regions 170 and 180, buried straps 164, and bitlines 184 are then formed.

New techniques for memory cell isolation are desirable. The new techniques should preferably facilitate fabrication of downsized memories.

SUMMARY

This section summarizes some features of the invention. Other features are described in the subsequent sections. The invention is defined by the appended claims which are incorporated into this section by reference.

In some embodiments of the invention, before the deposition of polysilicon 120 is completed, a blocking feature is formed adjacent to the trench side 124.2 to block the later deposited polysilicon portion of plate 120 from the area adjacent to trench side 124.2. The blocking feature can be dielectric left in the final structure, or can be a sacrificial feature which is removed after the polysilicon deposition to make room for other dielectric. The blocking features can be patterned using a mask comprising a plurality of straight strips each of which runs through the memory array in the row (i.e. wordline) direction. Therefore, the mask misalignment due to a shift in the row direction does not change the memory cell geometry and may have to be accommodated, if at all, only at the array boundary and in the periphery.

Some embodiments use STI. In some embodiments, the STI trench depth is defined independently of the profile of plate 120 and the profile of isolation between trenches 124 in the cross section of FIG. 1B. Therefore, the depth of STI dielectric 188 over polysilicon 120 in the cross section of FIG. 1B is not limited by the depth of the STI trenches. Consequently, the STI dielectric 188 can be more shallow in the cross section of FIG. 1B. (Of note, in FIG. 3, if the STI trenches are etched at the same time as polysilicon 120 and substrate 130 in regions 320, then the STI dielectric 188 depth cannot be made smaller than required by the STI trenches.) The use of shallower dielectric 188 over polysilicon 120 reduces the STI oxide aspect ratio and facilitates void-free filling with dielectric 188. Hence, the STI dielectric 188 width can be reduced, and the memory packing density increased. The invention is not limited to STI however, and other field isolation techniques, known or to be invented, are also possible.

In some embodiments, the trench sidewall on the side 124.2 has a substantially straight portion rising from below the bottom portion of dielectric 188 to a position above the bottom portion of dielectric 188 and above the polysilicon 120 portion adjacent to the side 124.2. See e.g. FIG. 13B.

The invention is not limited to the features and advantages described above. Some embodiments use materials other than polysilicon and silicon oxide. The invention can be practiced with the memory layout similar to that of FIG. 1A (see FIG. 13A), but is not limited such a layout. The invention is applicable to non-DRAM memories, for example to EEPROM (electrically erasable programmable read only memories) having floating gates in trenches. Other embodiments and variations are within the scope of the invention, is defined by the appended claims.

BRIEF DESCRIPTION OF THE DRAWINGS

FIGS. 5, 6, 7A show vertical cross sections of a memory array in the process of fabrication according to some embodiments of the present invention.
FIG. 7B is a top view of a memory array in the process of fabrication according to some embodiments of the present invention.
FIGS. 8, 9A show vertical cross sections of a memory array in the process of fabrication according to some embodiments of the present invention.
FIGS. 10B-10D, 11A, 11B, 12A-12C show vertical cross sections of a memory array in the process of fabrication according to some embodiments of the present invention.
FIGS. 13B-13D show vertical cross sections of a memory array according to some embodiments of the present invention.

DESCRIPTION OF SOME EMBODIMENTS

The embodiments described in this section illustrate but do not limit the invention. In particular, the materials, dimensions, and fabrication processes are not limiting. The invention is defined by the appended claims.

Figure 5:
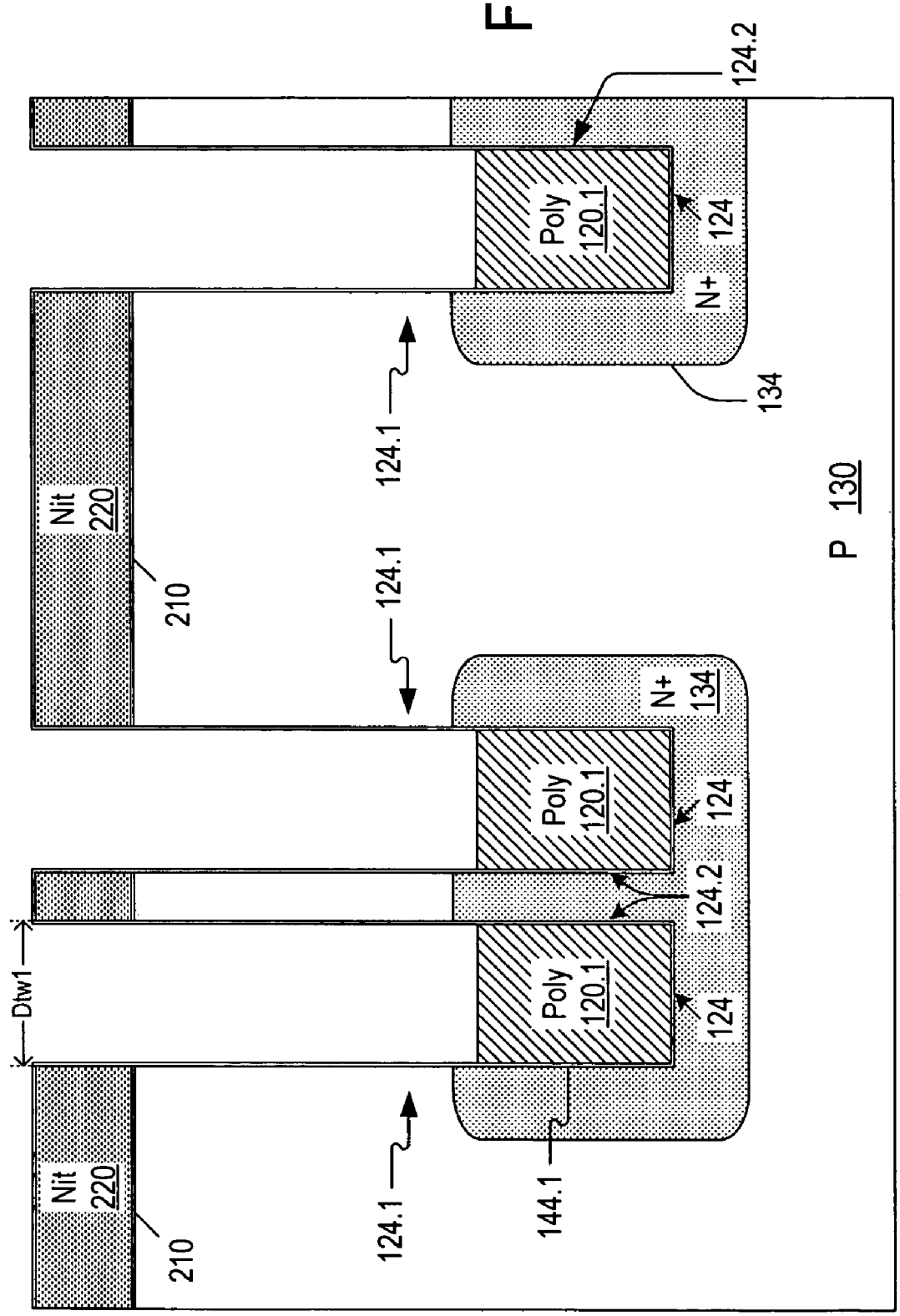
Figure 13A:
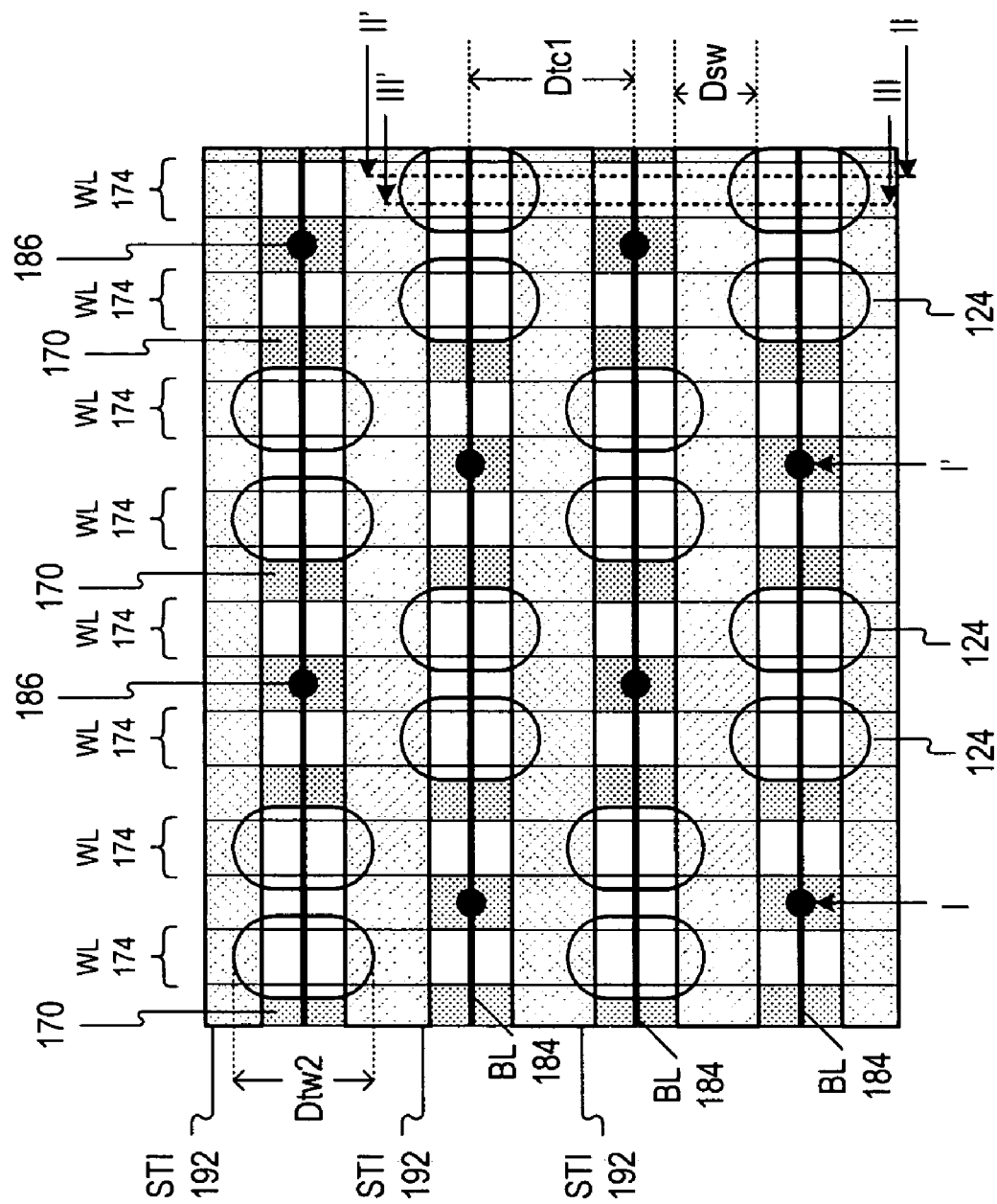
FIG. 13A is a top view of a memory array according to some embodiments of the present invention.

FIG. 5 illustrates the beginning fabrication stages for one DRAM embodiment of the present invention. The memory top view is shown in FIG. 13A, and a planar vertical cross section along a bitline 184 (line I-I') through the trench centers is shown in FIG. 13B. Trenches 124, bitlines 184, source/drain regions 170 and 180, and wordlines 174 are laid out as in FIGS. 1A and 1B, but dielectric 188 has a different layout. The planar vertical wordline cross sections along the lines II-II' (through a protruding portion 120.3 of capacitor plate 120 as seen in FIG. 13B) and III-III' (through the non-protruding portion of plate 120) are shown respectively in FIGS. 13C, 13D. In the view of FIG. 13B, each trench 124 has opposite sides 124.1, 124.2. The sides 124.2 of each trench pair face each other. The source/drain regions 170 are formed at sides 124.1 but not at sides 124.2.

As shown in FIG. 5 (cross section I-I'), silicon dioxide 210 and silicon nitride 220 are deposited over P type monocrystalline silicon substrate 130 (or a P type well or epitaxial layer of the substrate) and are patterned to define trenches 124. In one embodiment, oxide 210 is deposited by low pressure chemical vapor deposition (LPCVD) to a thickness of 25~50 Å at 1000~1150° C., and nitride 220 is deposited by LPCVD to a thickness of 150~200 nm at 770° C. (As noted above, the materials, dimensions, and deposition techniques are exemplary and not limiting.) Substrate 130 is etched to form the trenches 124. The trench depth can be above 7 μm for a 110 nm minimum photolithographic line width fabrication process. The trench width Dtw1 is 160 nm in this example.

ASG (not shown) is deposited over the wafer and etched down to a desired depth to remain only at the bottom of trenches 124. The wafer is heated to cause arsenic diffusion from the ASG into substrate 130, thus creating N+ doped capacitor plates 134. The ASG is etched out. A dielectric layer 144.1 is formed on the trench surface. In one embodiment, dielectric 144.1 is formed by LPCVD of silicon nitride to a 3~4 nm thickness, followed by LPCVD of silicon dioxide to a 0.5~2 nm thickness at 900~1000° C.

Figure 13C:
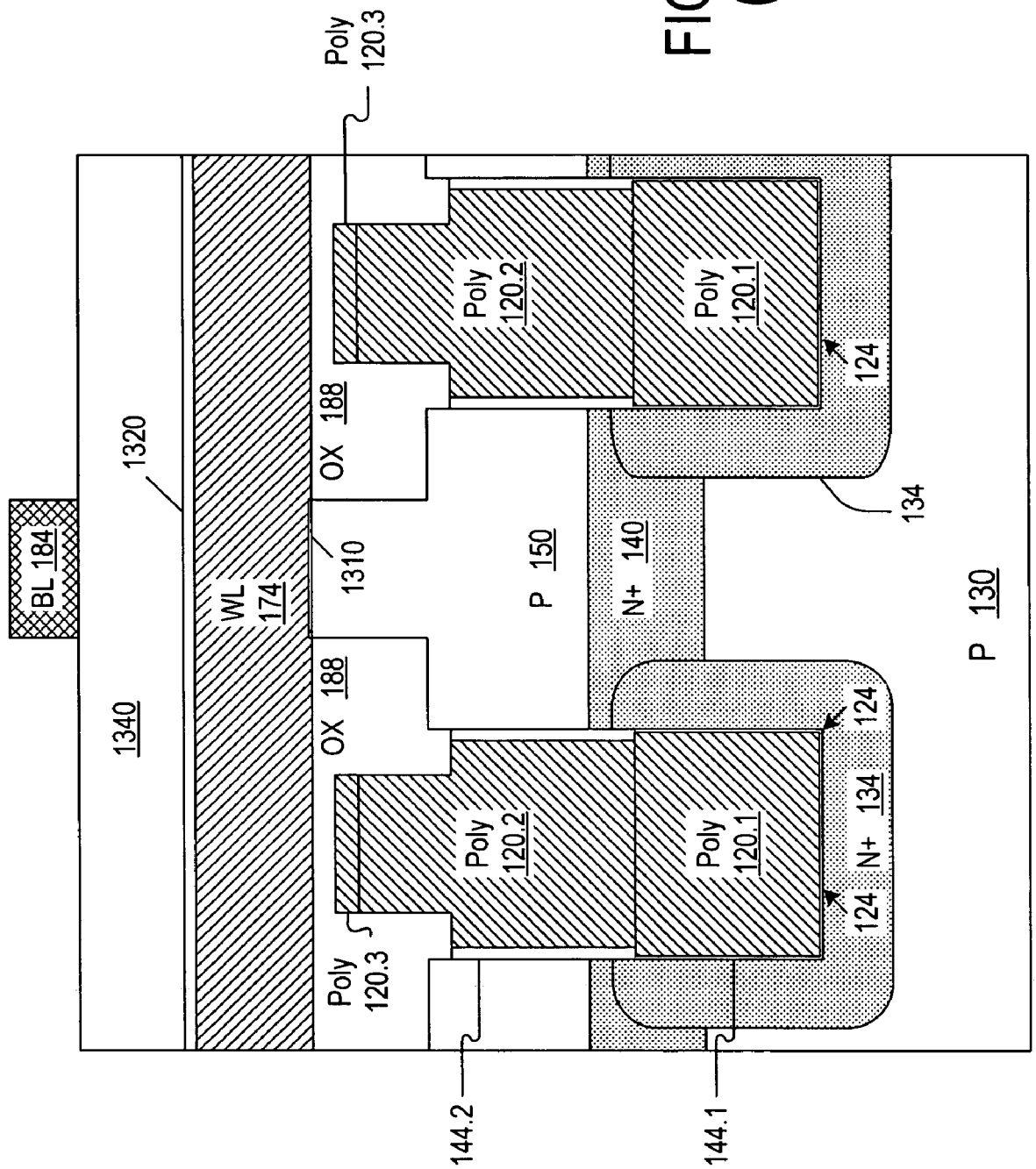
Figure 13D:
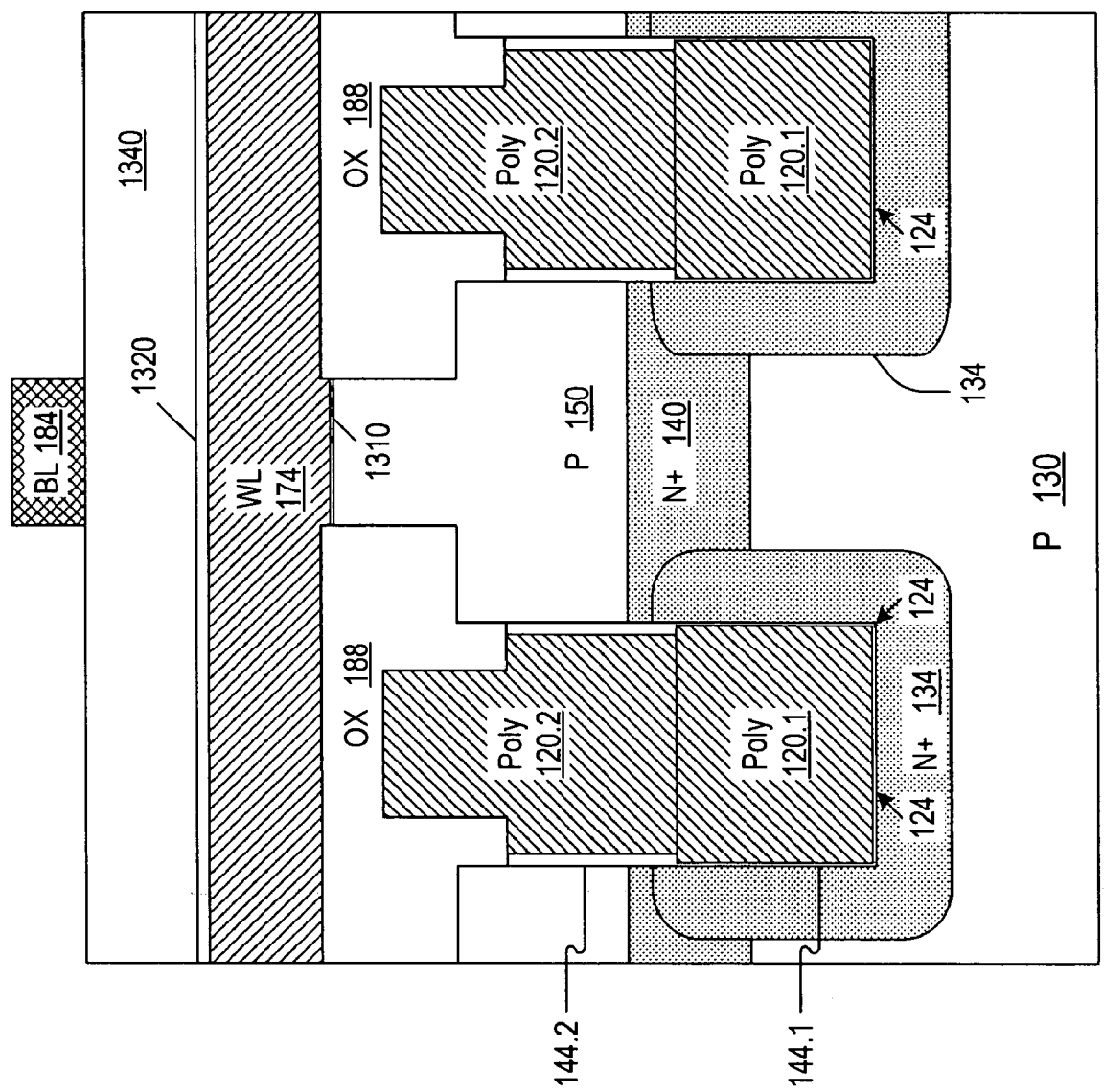

A conductive layer 120.1 is formed in trenches 124 to provide the bottom portion of capacitor plate 120 (shown as 120.1, 120.2, 120.3 in FIGS. 13B-13D). In one embodiment, layer 120.1 is arsenic doped polysilicon deposited by LPCVD to a thickness of 200~240 nm and then etched down to a level below the final top level position of N+ area 134, 140 (FIGS. 13B-13D). In some embodiments, polysilicon 120.1 is etched down to a depth of 0.7~1.3 μm below the top surface of substrate 130.

Figure 6:
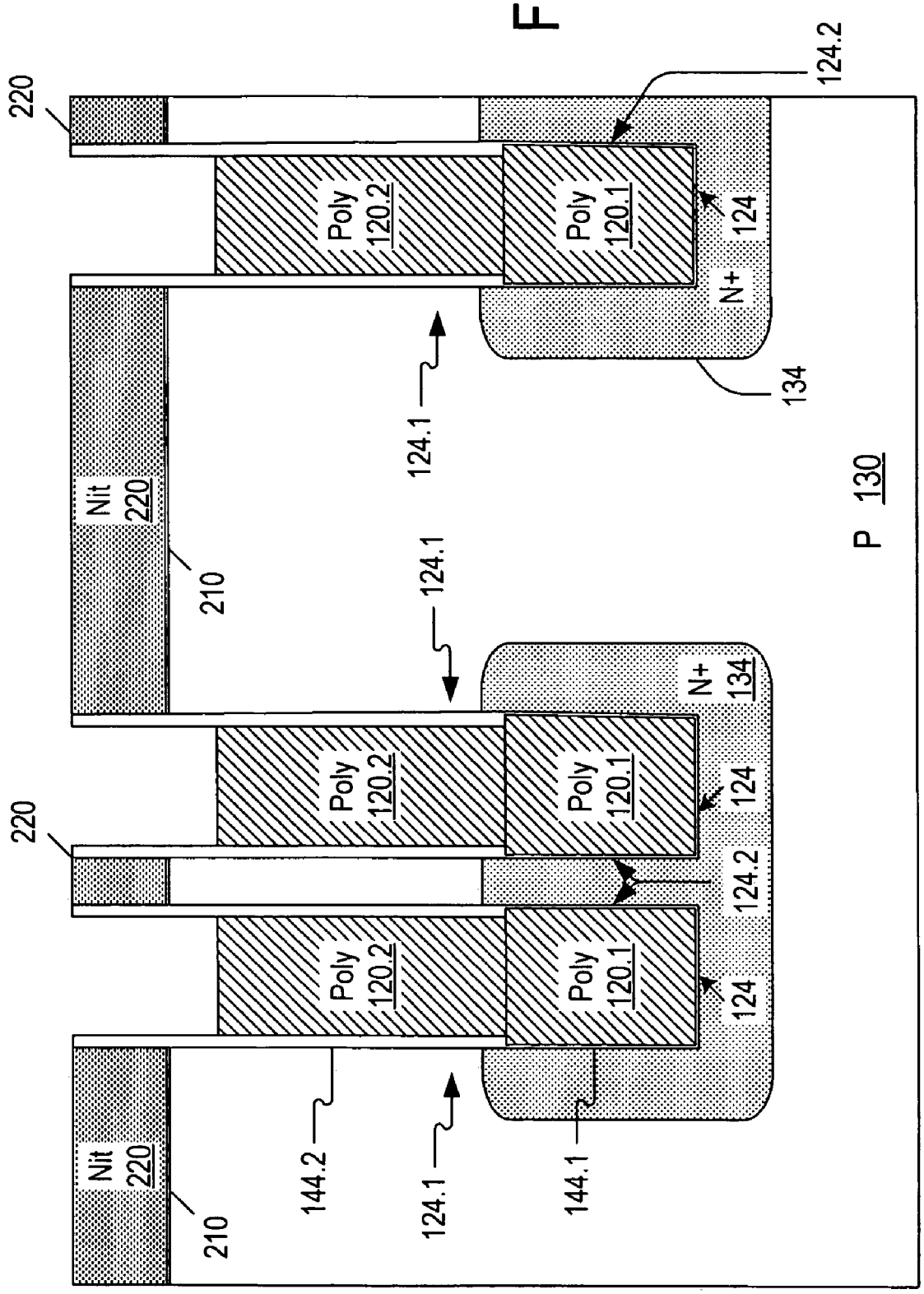

As shown in FIG. 6 (cross section I-I'), the exposed portions of dielectric 144.1 can optionally be removed, and a dielectric 144.2 ("collar oxide") is formed on the trench sidewalls. In one embodiment, dielectric 144.2 is undoped silicon dioxide deposited by LPCVD from TEOS to a thickness 20~40 nm. The deposition is followed by an unmasked anisotropic (vertical) etch to remove the oxide 144.2 from over the top surface of nitride 220 and the middle portions of polysilicon features 120.1 at the bottom of trenches 124, and to leave the oxide only on the sidewall surfaces of trenches 124, oxide 210 and nitride 220.

Conductive features 120.2 are formed in the trenches in physical contact with features 120.1. Features 120.2 provide additional portions of capacitor plates 120. In one embodiment, features 120.2 are arsenic doped polysilicon deposited and etched back using the same process as for the features 120.1. The top surface of the features 120.2 is about 100~170 nm below the top surface of substrate 130 in some embodiments.

A layer 704 (FIG. 7A, cross section I-I') is formed over the structure, filling the top portions of trenches 124 and covering the trenches 124 including the entire top surface of polysilicon 120.2. Layer 704 will block portions of trenches 124 during the deposition of polysilicon 120.3 (FIG. 13B), as explained below. Layer 704 can be a sacrificial layer, or can be left in the final structure. In some embodiments, layer 704 is silicon dioxide deposited from TEOS by chemical vapor deposition (CVD) with high density plasma (HDP), or by sub-atmospheric CVD (SA-CVD) to a thickness 200~250 nm. Exemplary deposition temperatures are 380~440° C. Optionally, oxide 704 can be polished by CMP stopping on nitride 220 (this variation is not shown).

A mask 710 (see FIG. 7A and top view FIG. 7B), for example, photoresist, is formed over the structure. As will be seen below, mask 710 will define the profile of the bottom surface of dielectric 188 (FIG. 13B). The mask 710 overlies the trench sidewalls and overlaps the trenches 124 on the sides 124.2. In FIGS. 7A and 7B, the mask 710 also overlies the areas between the adjacent trenches 124 in each cell pair. The mask 710 extends laterally over the trenches 124 by some distance D1 (FIG. 7A) possibly (but not necessarily) exceeding the thickness of oxide layers 144.1, 144.2. In some embodiments, the mask 710 reaches the point over the middle of trenches 124, i.e. D1 can be half the trench width Dtw1 measured in the column (i.e. bitline) direction. As shown in FIG. 7B, the mask 710 can form a number of straight strips in the array area, each strip running through the array in the row direction. Therefore, the mask misalignment due to a shift in the row direction does not change the cell geometry and may have to be accommodated, if at all, only at the array boundary and in the periphery.

Figure 8:
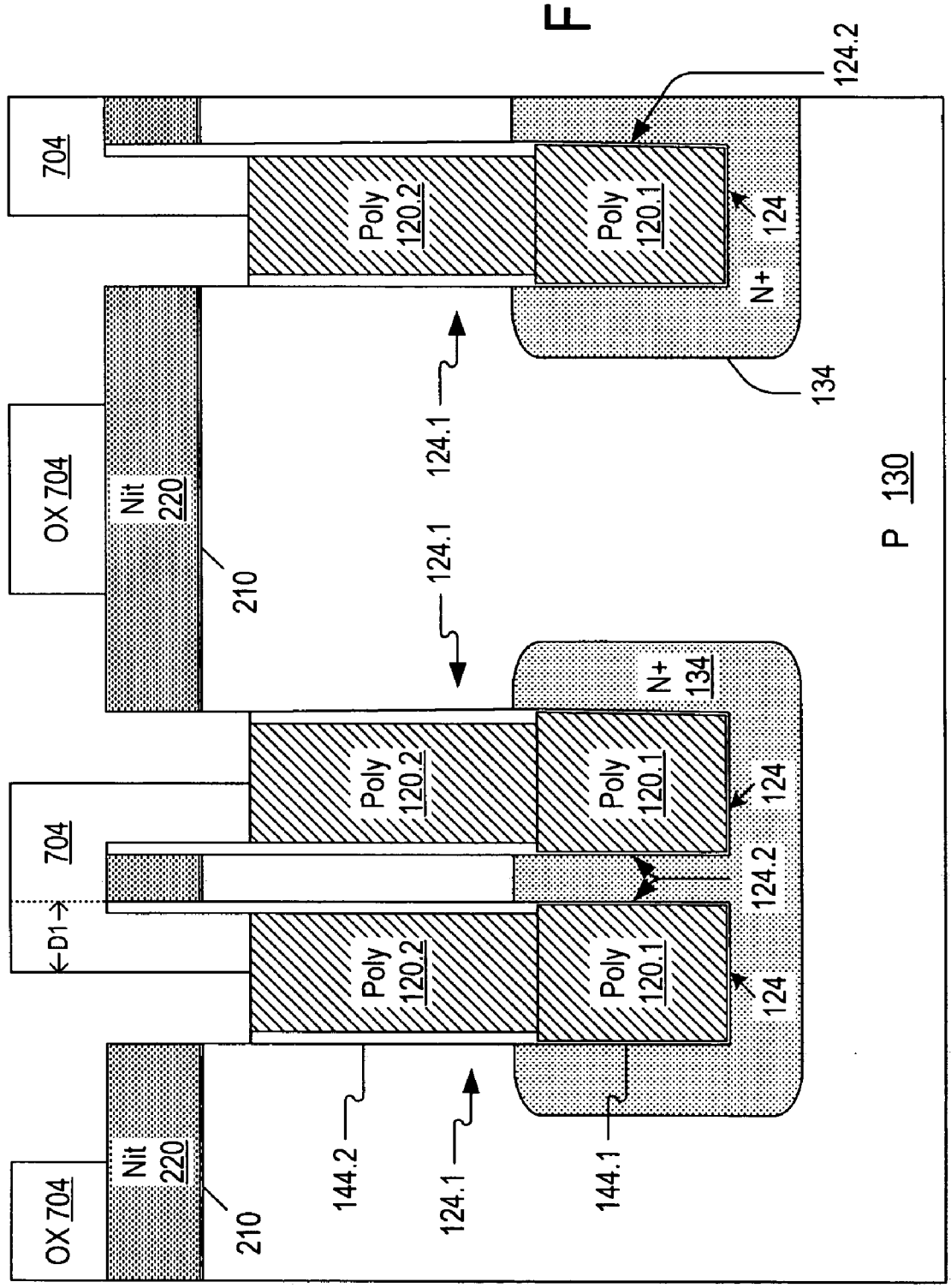

As shown in FIG. 8 (cross section I-I'), portions of dielectric layers 704, 144.2 are etched away through the mask openings. The etch stops on polysilicon 120.2 and nitride 220. A dry $C_xF_y$ oxide etch is used in some embodiments.

Resist 710 is removed, and a short wet oxide etch is conducted to remove any residues of oxide 704, 144.2 from the exposed trench sidewalls above polysilicon 120.2. A dilute HF or buffered HF etch is used in some embodiments.

The structure is placed in a furnace and heated to a temperature 650~730° C. in a nitrogen atmosphere to introduce nitrogen into the exposed portions of the trenches' silicon sidewalls thus forming a thin silicon nitride layer (not shown) on the exposed trench surfaces and, in particular, in contact areas 160 (FIG. 13B). This layer will impede formation of crystal dislocations in silicon 130 that could be caused by polysilicon 120.3 and thus will reduce junction leakage. An exemplary thickness of this layer is 5~15 Å.

Figure 9B:
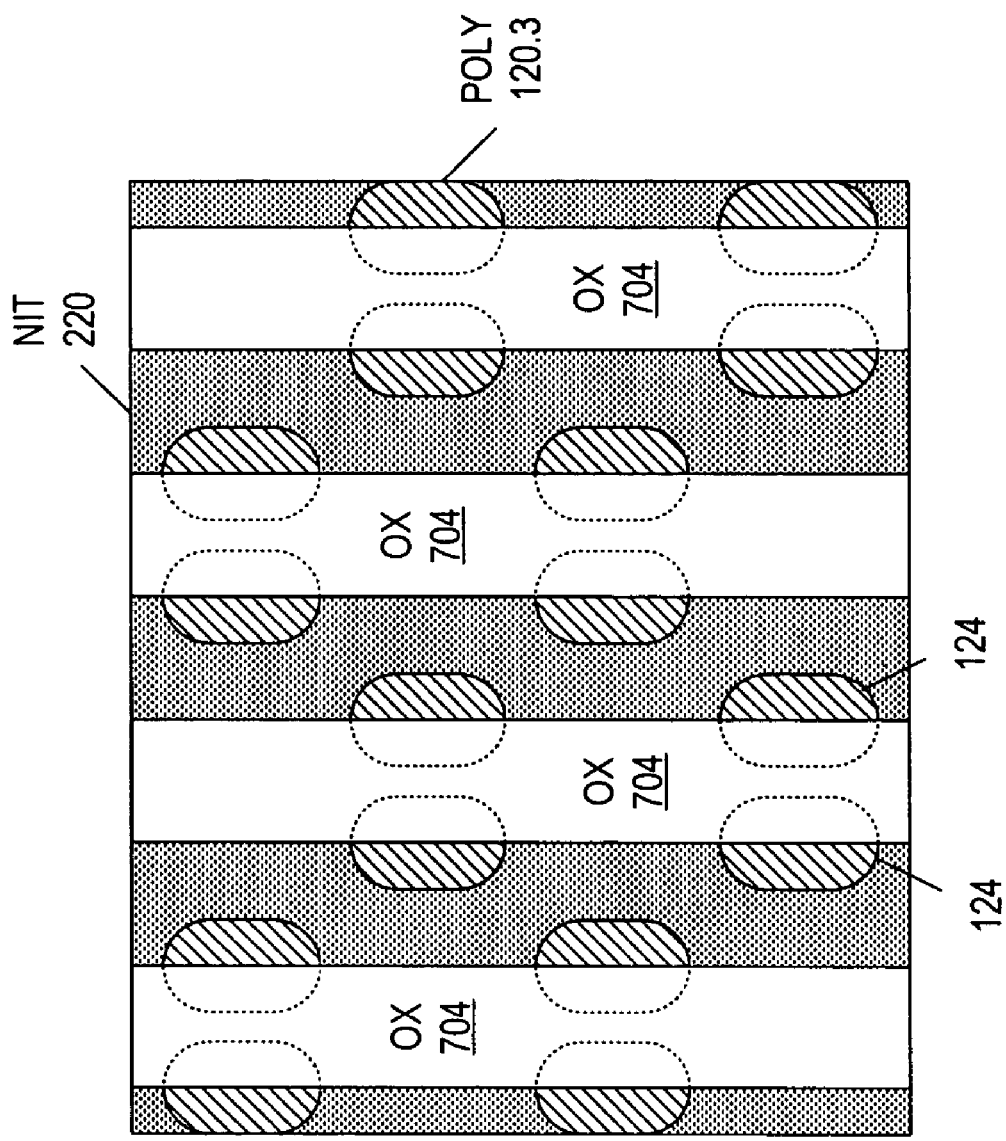
FIGS. 9B, 10A are top views of a memory array in the process of fabrication according to some embodiments of the present invention.

Conductive layer 120.3 (FIG. 9A, cross section I-I', and FIG. 9B, top view) is formed on the wafer. Layer 120.3 will provide portions of capacitor plates 120 adjacent to contact areas 160. Layer 704 blocks the layer 120.3 adjacent to the trench sides 124.2. Therefore, in some embodiments the layer 120.3 will not have to be etched out near the sides 124.2 as would otherwise be desirable to make room for isolation dielectric 188 (FIG. 13B). In some embodiments, layer 120.3 is arsenic doped polysilicon deposited to a 240 nm thickness by LPCVD at 550~640° C. and planarized by CMP. The CMP process stops on oxide 704. (If oxide 704 was itself polished by CMP at the stage of FIG. 7A before the fabrication of mask 710, and the oxide CMP stopped on nitride 220, then the CMP of polysilicon 120.3 can stop on the silicon nitride 220.) Then polysilicon 120.3 is recessed by a suitable etch (a plasma dry etch for example). In some embodiments, the top surface of polysilicon 120.3 is recessed 20~60 nm below the top surface of substrate 130. (The polysilicon CMP can be omitted, and polysilicon 120.3 can be simply etched down to its final thickness.)

Active area mask 1010 (FIG. 10A, top view, and FIGS. 10B-10D, cross sections I-I', II-II', III-III') is formed over the wafer to define shallow trench isolation (STI) regions 192 between the memory columns. In some embodiments, mask 1010 is boron doped silicon dioxide deposited by plasma enhanced CVD (PECVD) from TEOS at a temperature of 380~450° C. to a thickness of 200~300 nm and patterned with photoresist (not shown). If layer 1010 is silicon dioxide, some or all of oxide 704 can be etched away in the STI regions when layer 1010 is being patterned, as shown in FIGS. 10A, 10C, 10D.

Figure 10A:
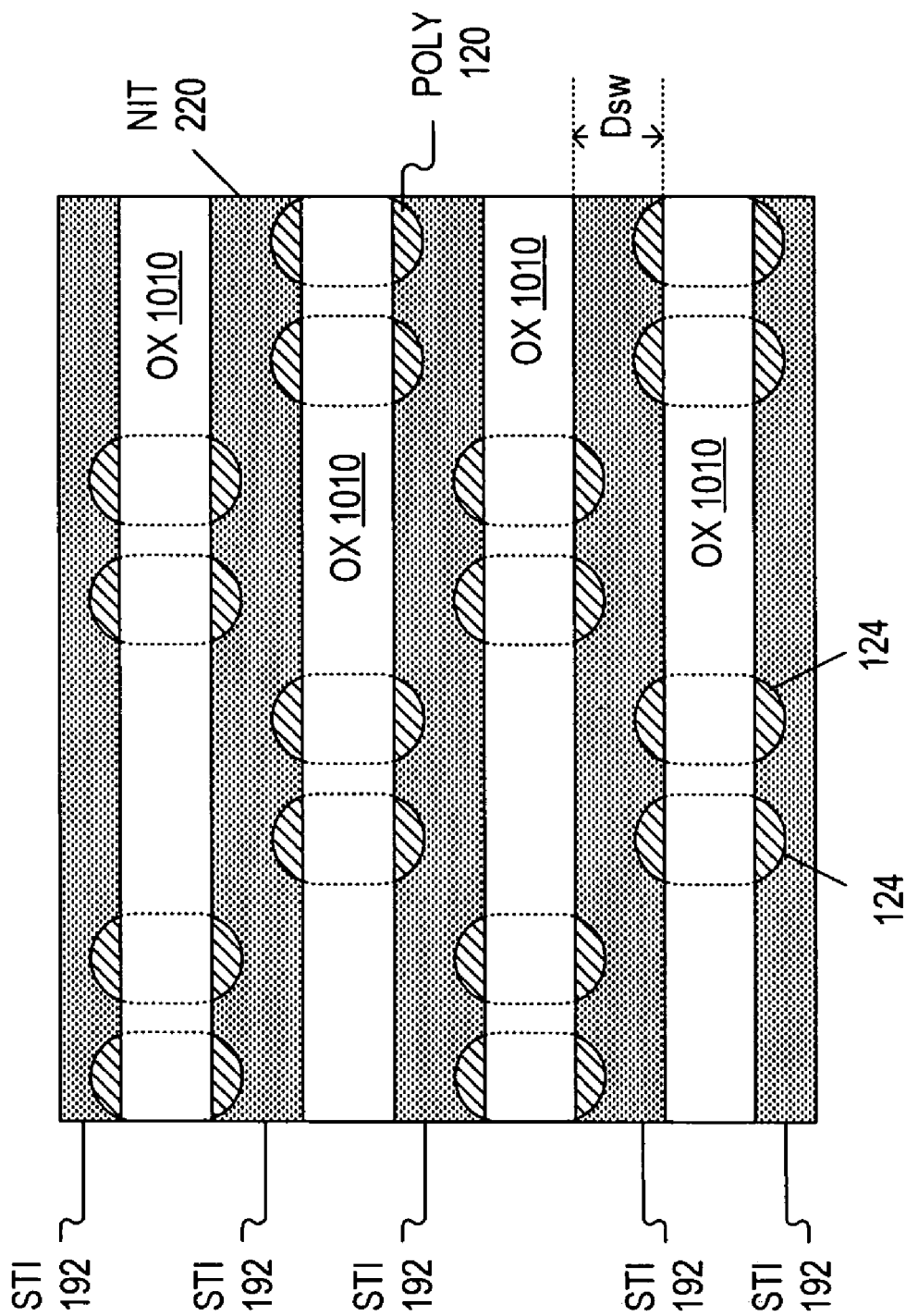
Figure 10D:
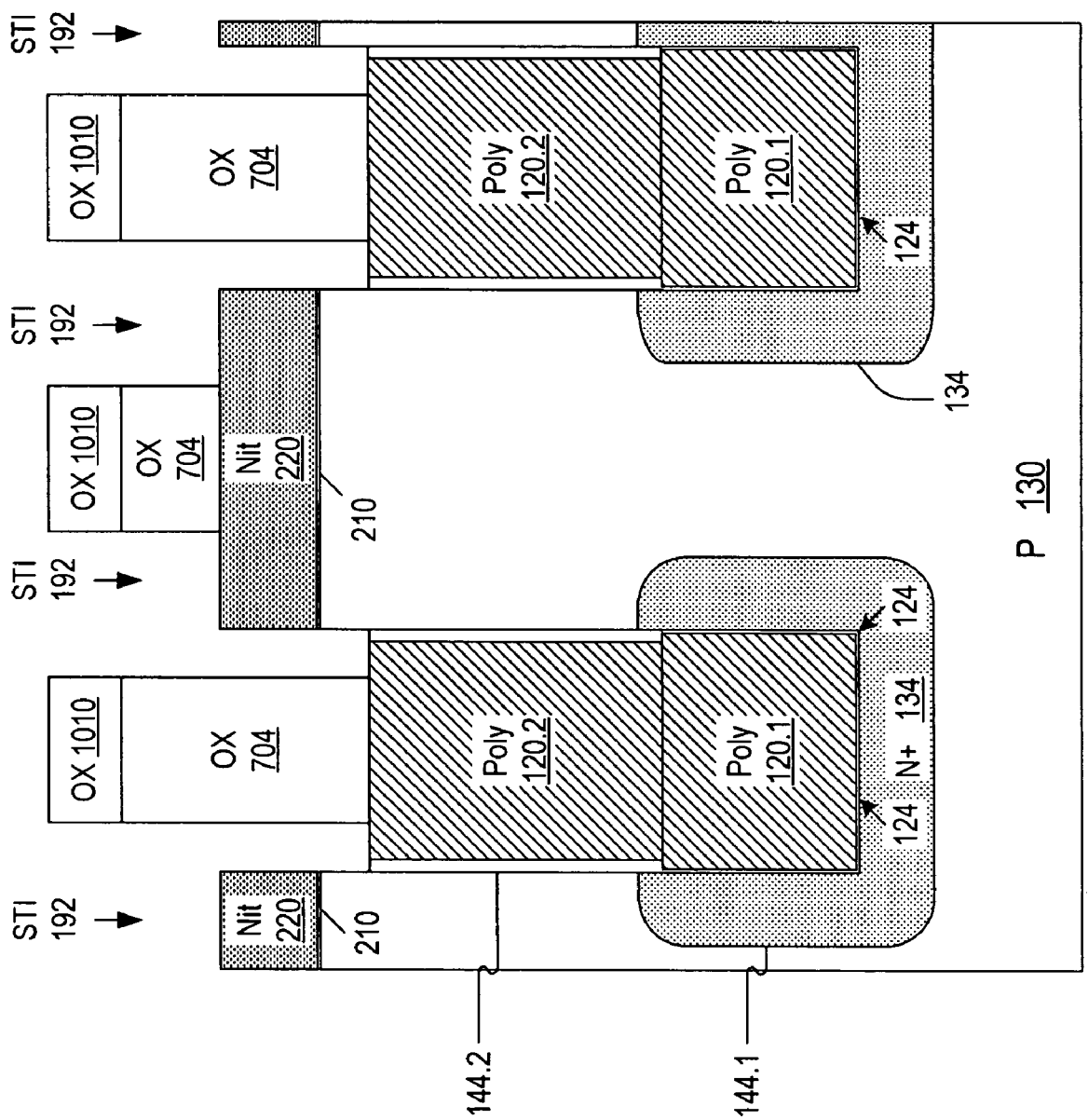

As shown in FIG. 10A, mask 1010 forms straight strips in the array area, with each strip running through the array in the column direction. Therefore, any mask shift in the column direction does not affect the array geometry except possibly at the array boundary.

Mask 1010 can also be used to define the STI regions in the periphery (not shown).

Figure 11A:
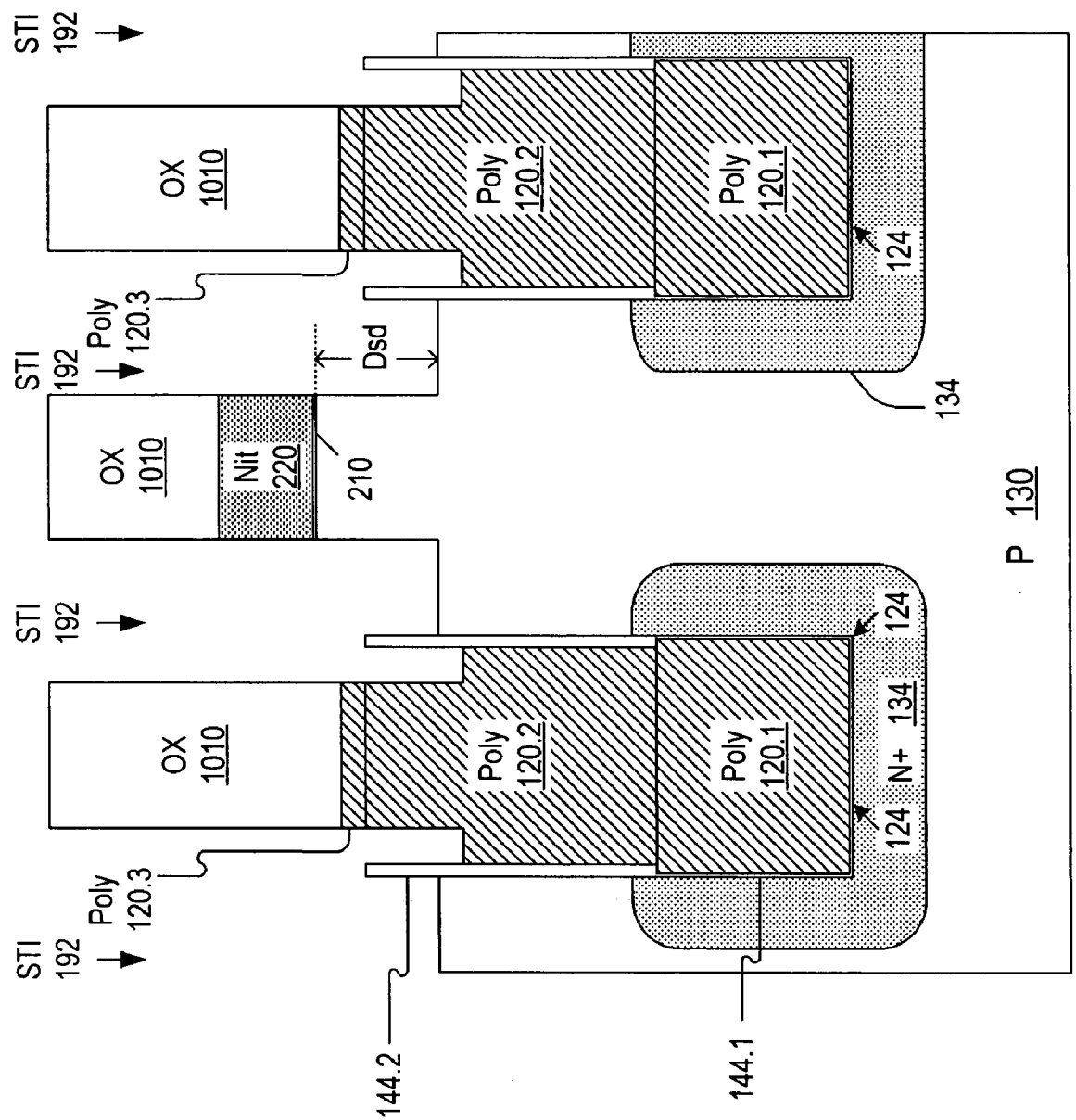
Figure 11B:
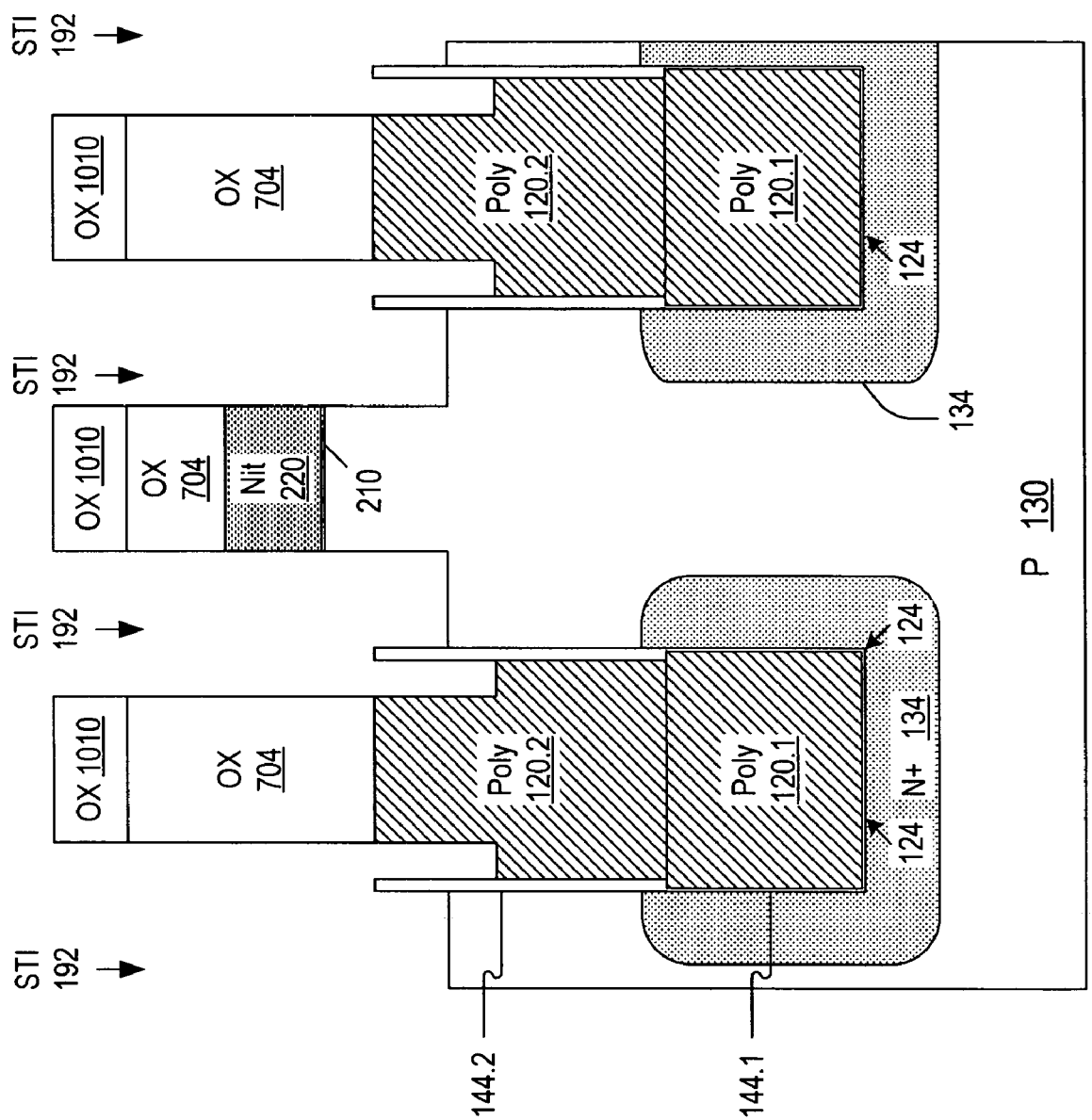

A silicon nitride etch selective to silicon dioxide removes the exposed nitride 220. See FIGS. 11A (cross section II-II') and 11B (III-III'). A short oxide etch removes the exposed portions of oxide 210. The exposed silicon 130 and polysilicon 120 are etched selectively to silicon dioxide to form the STI trenches.

Figure 12B:
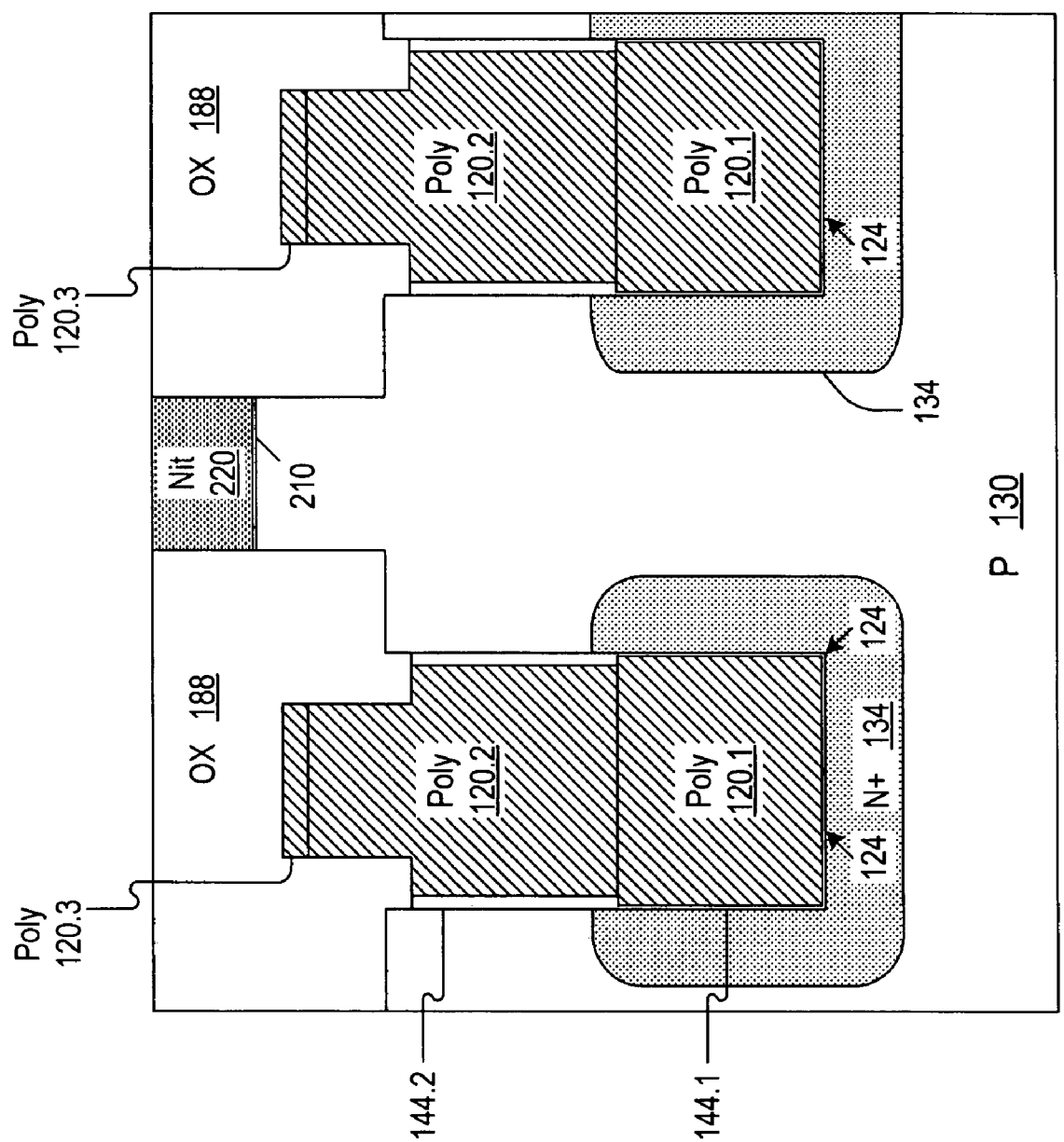

Optionally, a silicon dioxide etch is performed to remove oxide layers 704, 1010 and also to remove oxide portions 144.2 protruding above polysilicon 120. See FIGS. 12A, 12B, 12C showing the respective cross sections I-I', II-II', III-III'. Dielectric 188 is formed over the wafer to fill the STI trenches and the areas above the polysilicon 120. In some embodiments, dielectric 188 is silicon dioxide deposited by HDP CVD to a thickness 400~500 nm and planarized by CMP stopping on nitride 220. Oxide 188 will insulate the adjacent trenches from each other in each cell pair.

Figure 1A:
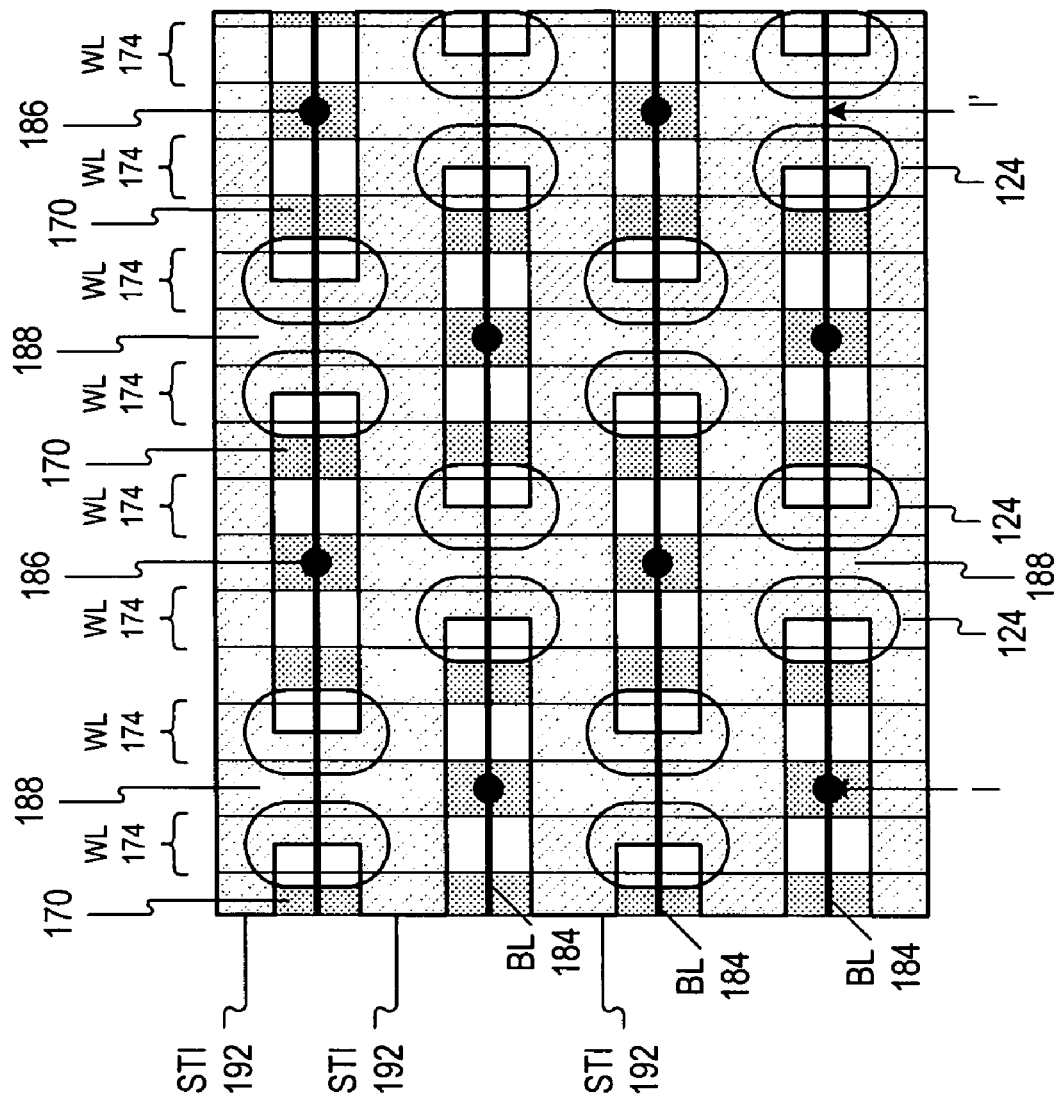
FIG. 1A is a top view of a prior art memory array.
Figure 1B:
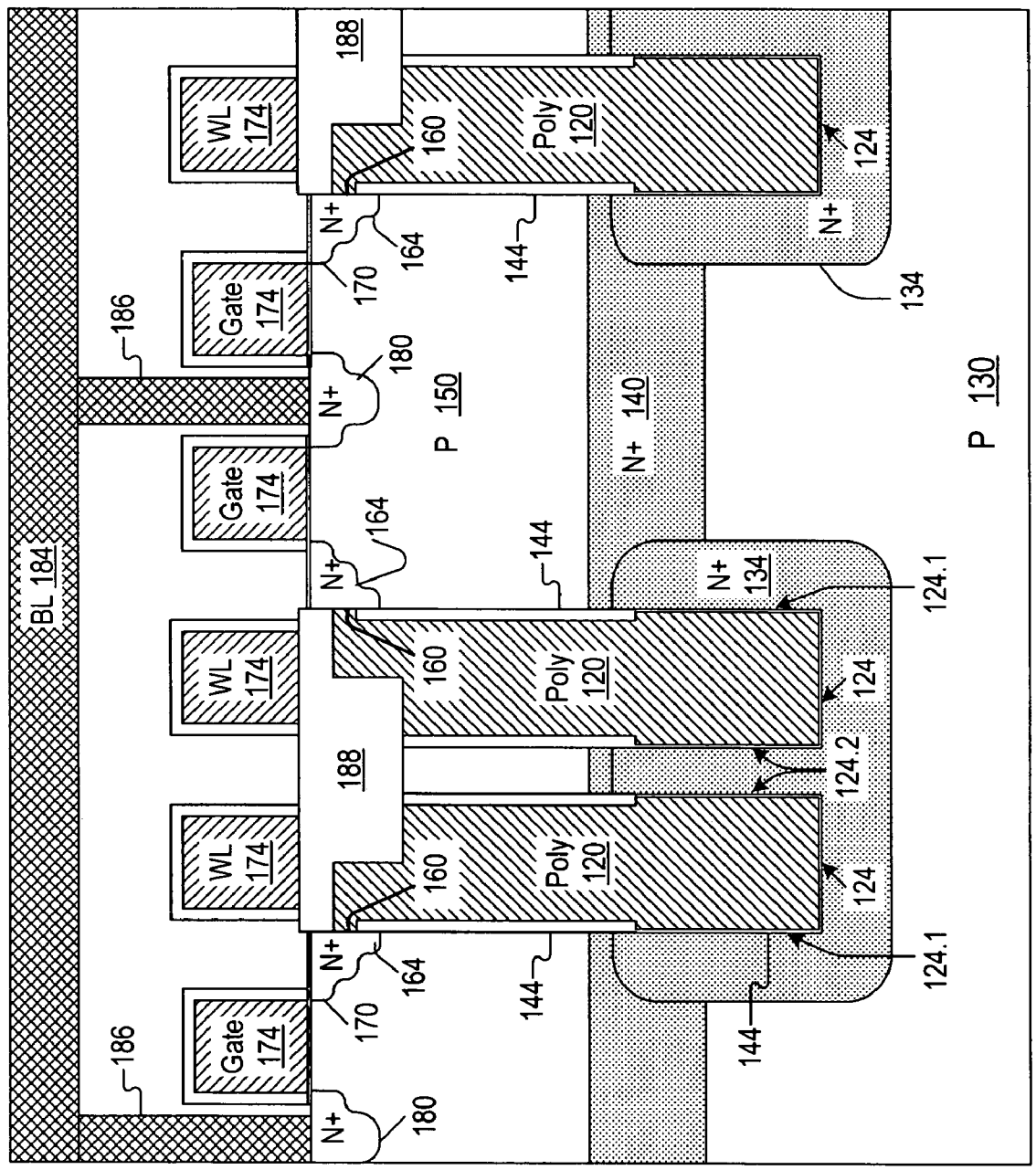
FIG. 1B shows a vertical cross section of the array of FIG. 1A.
Figure 2:
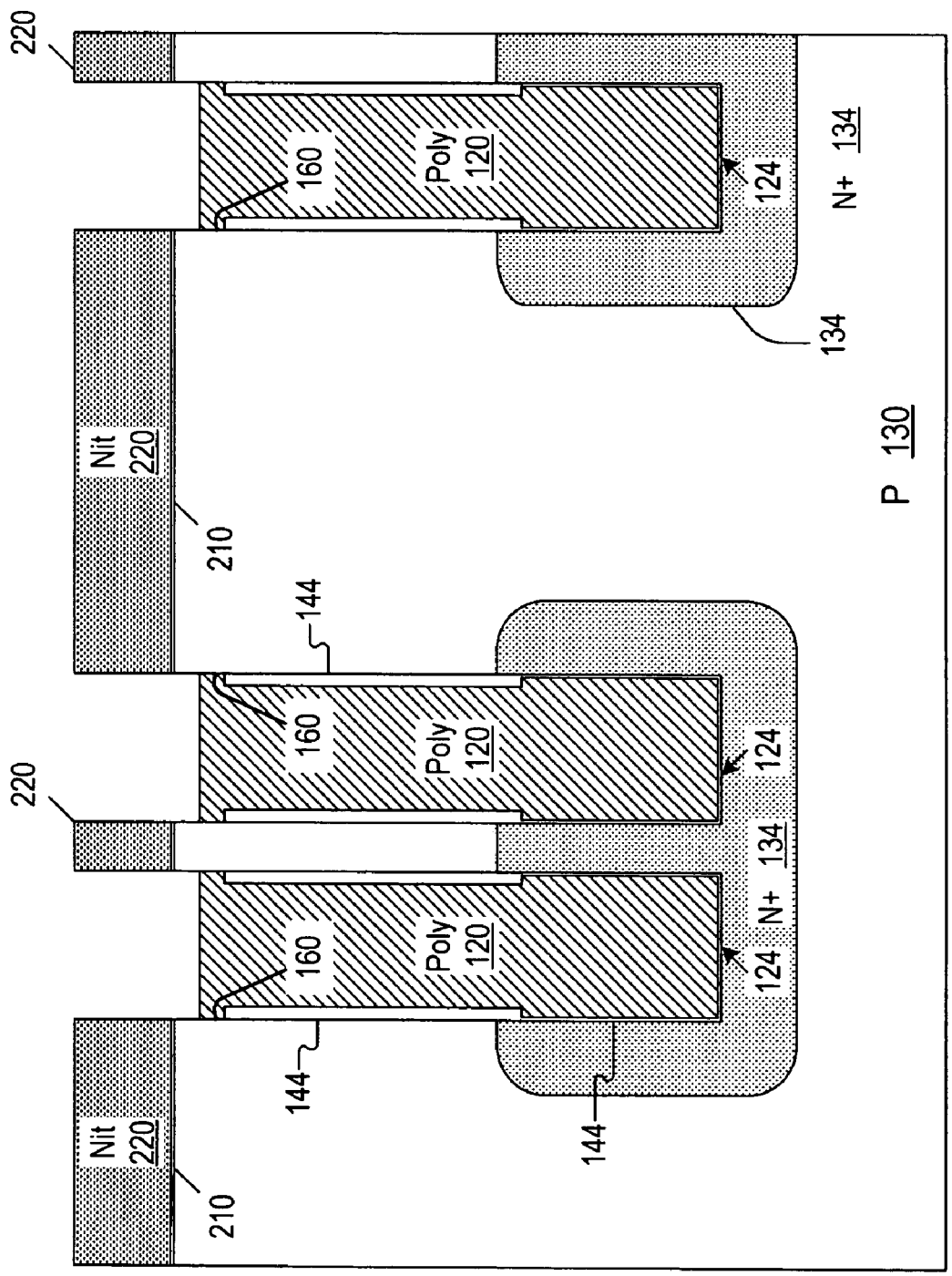
FIGS. 2-4 show vertical cross sections of the array of FIG. 1A in the process of fabrication.
Figure 3:
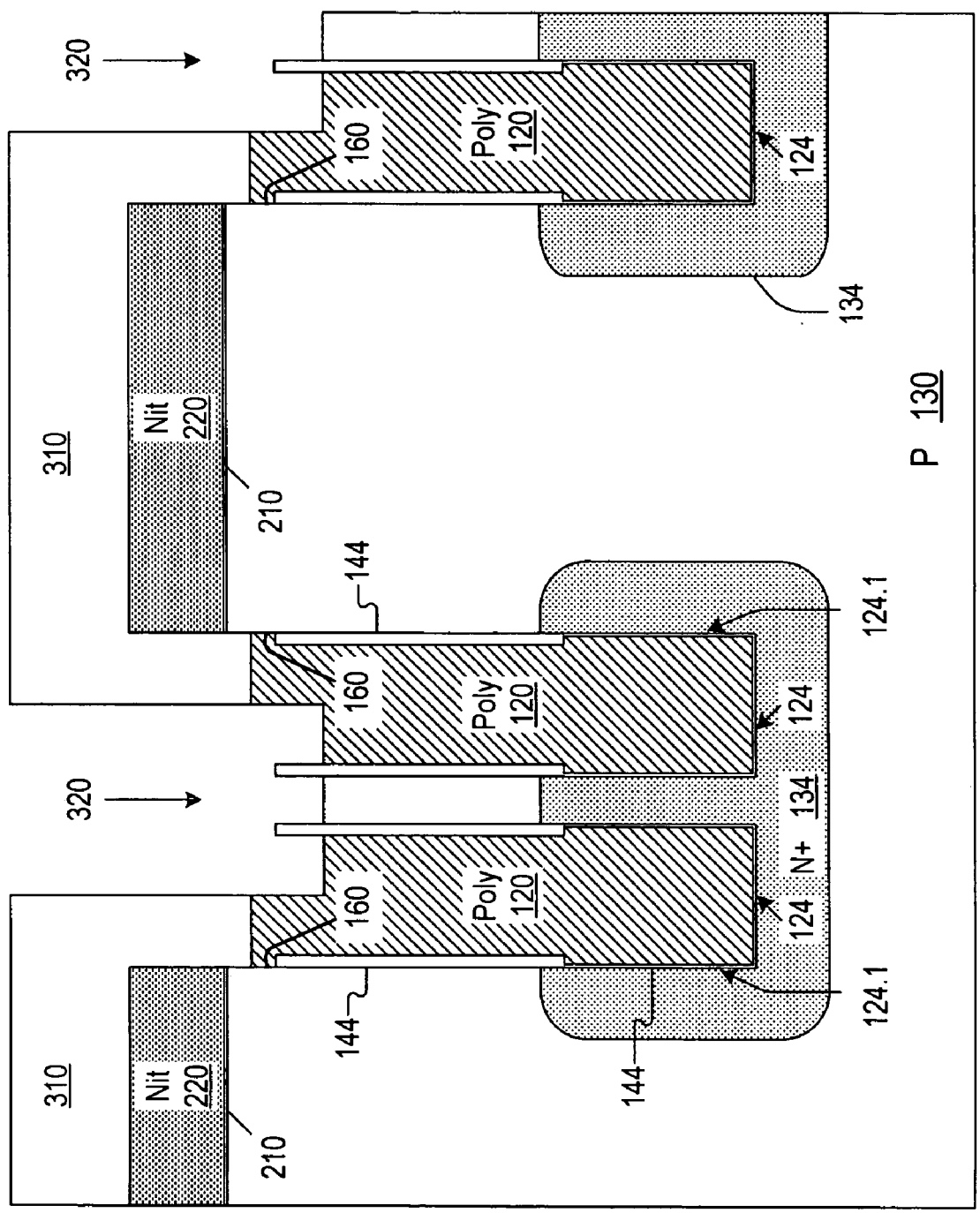
Figure 4:
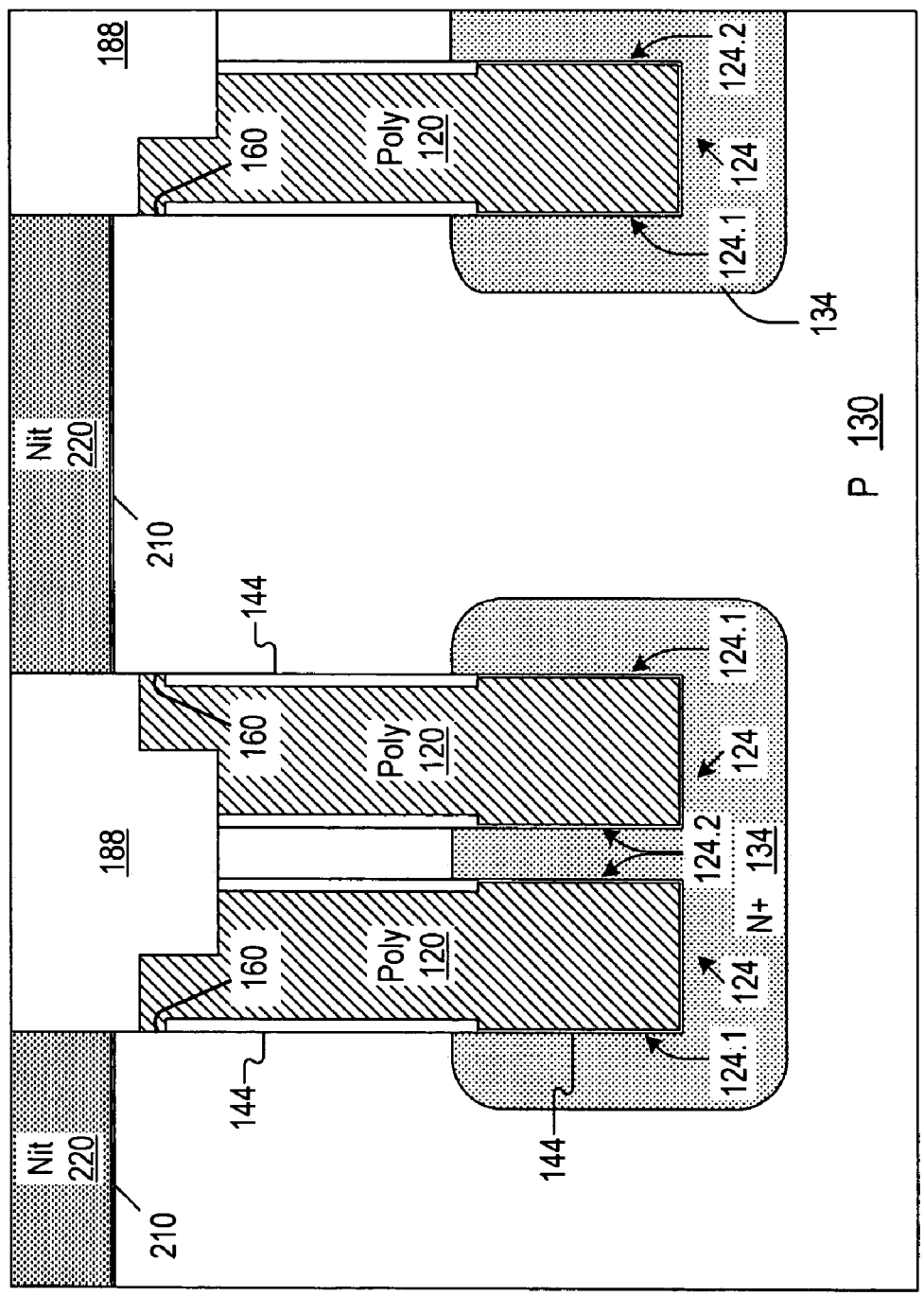

The memory fabrication can be completed using the same steps as for the memory of FIG. 1A. In the example of FIGS. 13A-13D, a dopant implantation step is performed to form N+ band region 140 interconnecting the capacitor plates 134. Oxide 188 is polished or etched down to reduce the surface non-planarity. Nitride 220 and oxide 210 are removed. Silicon dioxide 1310 is grown on silicon substrate 130 to provide gate dielectric for the pass transistors. Doped polysilicon 174 and dielectric 1320 (e.g. silicon nitride) are then deposited. A photoresist mask (not shown) is formed to define wordlines 174. Layers 1320, 174, 1310 are etched through the mask openings to form the gate stacks. Dielectric spacers 1330 are formed on the wordline sidewalls. Dopant is implanted before and after the fabrication of spacers 1330 to form lightly doped source/drain regions 170, 180 and buried straps 164 (the buried straps doping is also provided by dopant diffusion from polysilicon 120). Dielectric 1340 (e.g. borophosphosilicate glass) is formed on the wafer. Contact plugs 186 and bitlines 184 are formed using known techniques. Other memory fabrication methods, known or to be invented, can also be used. Wordlines 174 and bitlines 184 do not have to be straight lines; they can zigzag through the memory. Other variations are also possible. The "column direction" is defined as a general direction along a bitline, across multiple wordlines. The "row direction" is a general direction along a wordline, across multiple bitlines.

Figure 14A:
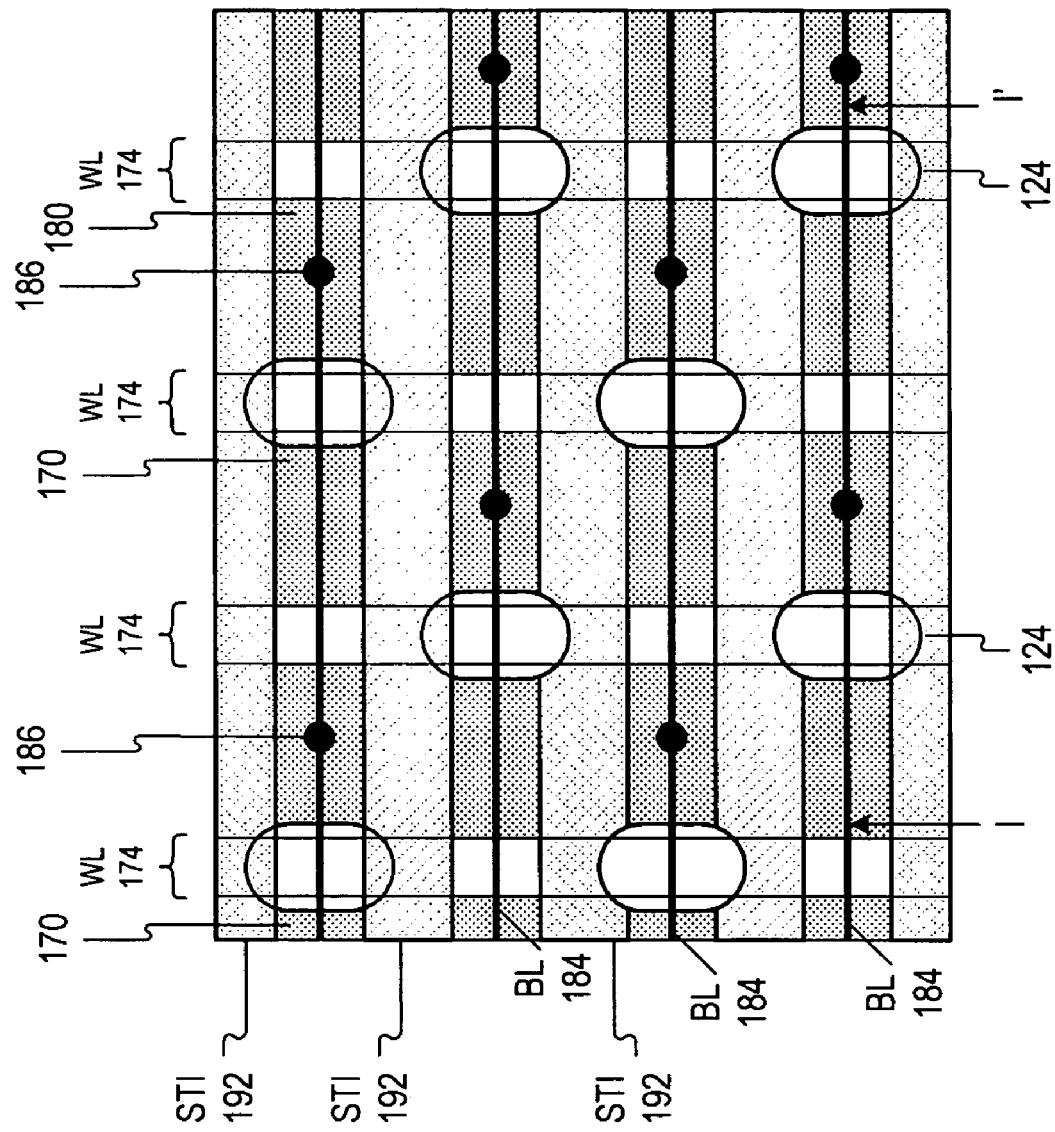
FIG. 14A is a top view of a memory array according to some embodiments of the present invention.
Figure 14B:
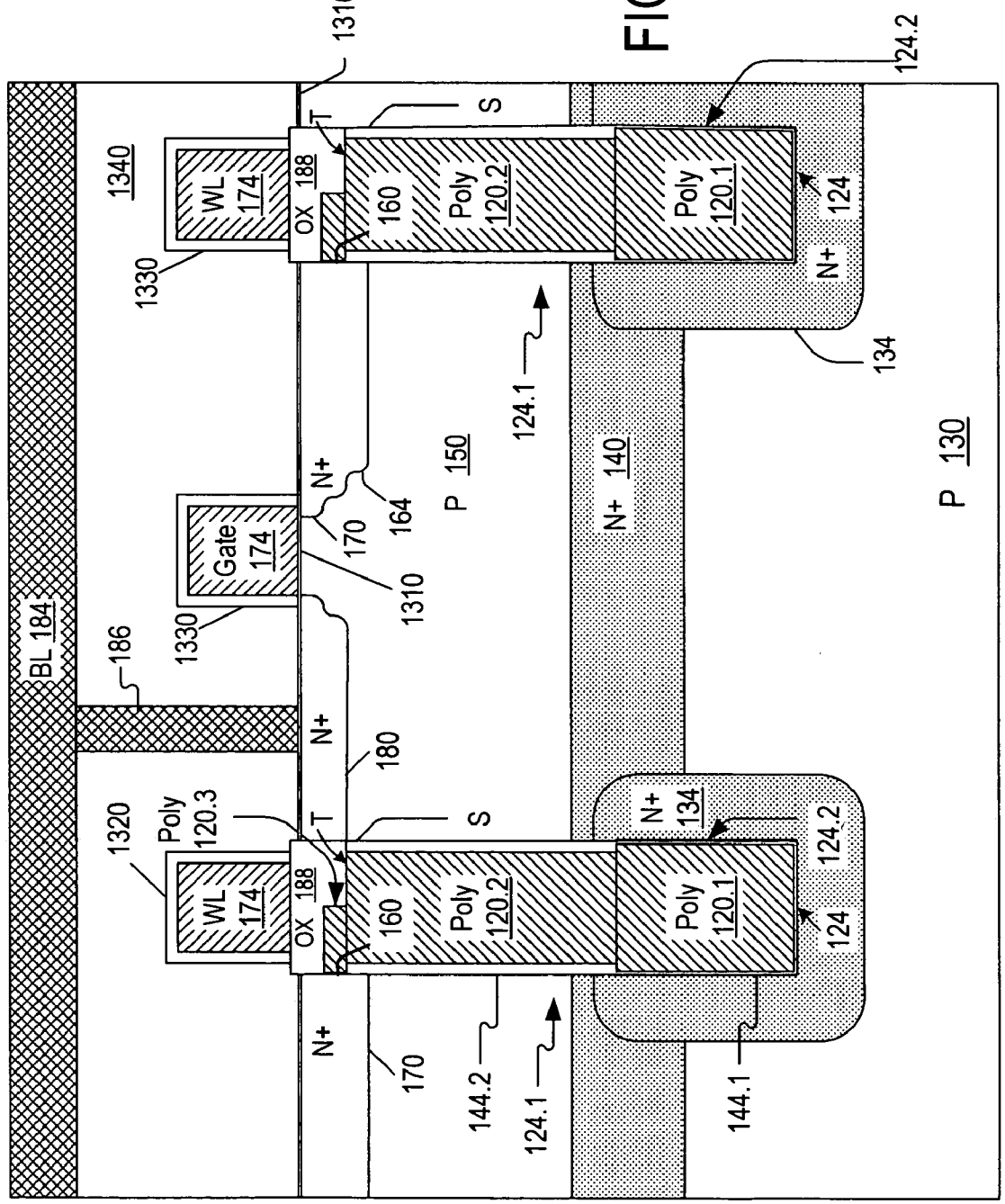
FIG. 14B shows a vertical cross section of a memory array according to some embodiments of the present invention.
Figure 15:
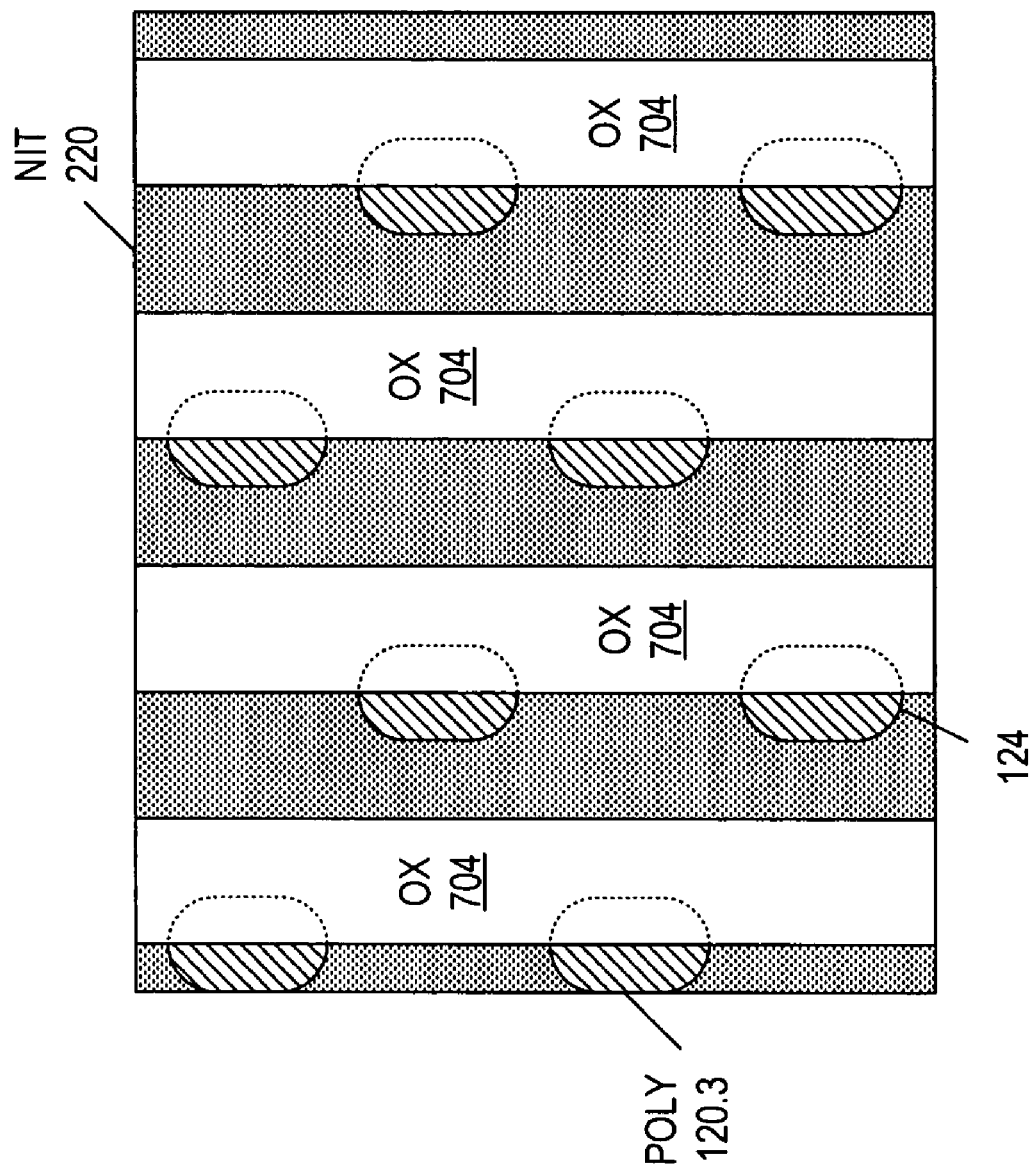
FIG. 15 is a top view of a memory array according to some embodiments of the present invention.

FIG. 14A illustrates another possible layout. FIG. 14B shows a planar vertical cross section I-I' taken along a bitline. The memory is similar to the memory of FIGS. 13A-13D except that the cells are not paired, with a pass transistor located to the left of the corresponding trench 124 in each cell, on trench side 124.1. Trench side 124.2 is the opposite side. The fabrication process can be as for the memory of FIG. 13A. FIG. 15 shows a top view of oxide 704 (and mask 710), forming a plurality straight strips running through the array in the row direction for the memory of FIG. 14A. The active area mask can be as mask 1010 (FIG. 10A). Other layouts, known or to be invented, are also possible. Further, the invention is applicable to electrically erasable programmable read only memories (EEPROMs) having a floating gate at least partially located in a trench, as described for example in U.S. patent application Ser. No. 10/252,143 filed on Sep. 19, 2002 by Yi Ding and incorporated herein by reference.

FIGS. 13B, 14B illustrate certain structural features of some embodiments of the present invention. Each pass transistor has a source/drain region 170 electrically coupled to the corresponding conductive charge storage node 120 (120.1, 120.2, 120.3). The coupling is via a conductive path through contact area 160, but capacitive coupling is also possible (as in an EEPROM). The source/drain region 170 is provided on the side 124.1 of each trench 124 but not on the opposite side 124.2. In FIG. 13B, the trench sides 124.2 face each other in each pair of memory cells. In FIG. 14B, each side 124.1 faces the side 124.2 of the adjacent trench in the same column. The charge storage node 120 has a protrusion 120.3 on its top surface adjacent to trench side 124.1 and adjacent to the corresponding source/drain region 170. The charge storage node 120 has a top surface portion T laterally adjacent to the protrusion (this is the top surface portion of layer 120.2 not covered by layer 120.3). The trenches have vertical sidewalls, but this is not necessary. The sidewalls can be at some other angle. The sidewalls are straight, but this is also unnecessary. The sidewalls may have other shapes. In FIGS. 13B, 14B, the trench sidewalls have a substantially straight portion S on each side 124.2. The straight sidewall portion S rises from below the top surface portion T of polysilicon 120.2 to a position above the top surface portion T of polysilicon 120.2. In FIGS. 13B, 14B, the sidewall portions S extend up to the top surface of substrate 130, but this is not necessary.

Figure 16:
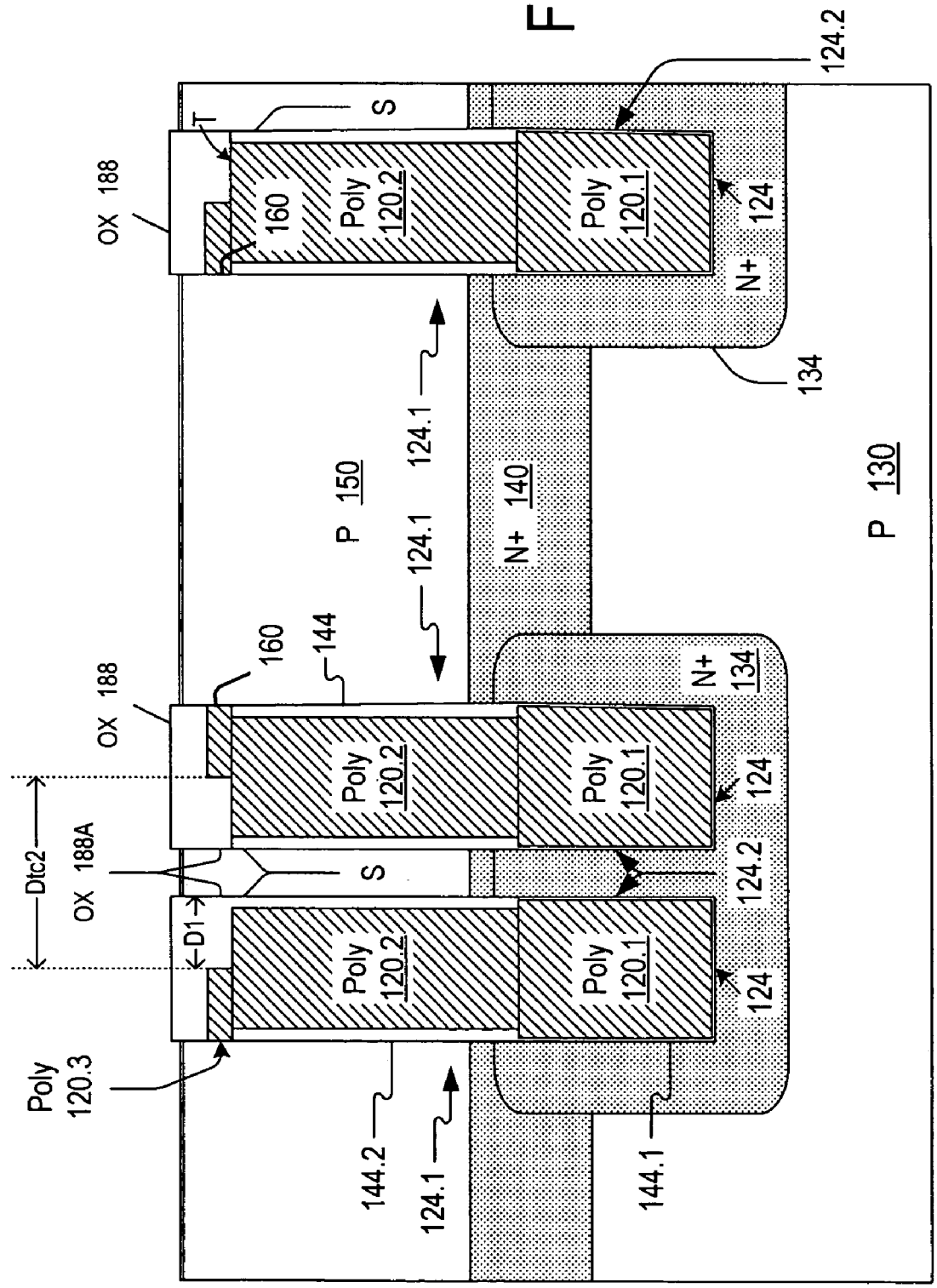
FIG. 16 shows a vertical cross section of a memory array according to some embodiments of the present invention.

FIG. 16 is the same view as FIG. 13B, with some features deleted for clearer illustration of certain dimensions. Dielectric 144.1, 144.2, 188 covers the trench sidewalls and overlies the charge storage node 120. Numeral 188A denotes the portion of dielectric 188 over the surface T of polysilicon 120.2. Dielectric 188A extends to the trench sidewall on the side 124.2. Dielectric 188A has a thickness D1 measured normally to the trench sidewall (from right to left in FIG. 16, see also FIG. 7A). D1 is larger than the thickness of dielectric 144.1 or 144.2 on the trench side 124.1. Thus, the maximum dielectric thickness on the trench sidewall on the side 124.2 is larger than the maximum dielectric thickness on the trench sidewall on the side 124.1. Sidewall portion S rises from below the bottom surface of dielectric 188A to a position above the bottom surface of dielectric 188A.

In one exemplary embodiment, with the minimal photolithographic line width of 110 nm, the trench width Dtw1 (FIG. 7A) in the column direction is 160 nm. The trench width Dtw2 (FIG. 13A) in the row direction is 230 nm. The distance Dtc1 between the trench centers in the adjacent columns in the row direction is 220 nm. The distance Dtc2 (FIG. 16) between the trench centers in the adjacent rows in each trench pair is 220 nm. The STI width Dsw (FIG. 13A), measured as the distance between the adjacent strips of mask 1010 in FIG. 10A, is 110 nm. The STI depth Dsd (FIG. 11A) in substrate 130 (measured from the substrate's top surface) is 445 nm. These dimensions are not limiting.

The STI trench depth Dsd is defined independently of the profile of plate 120 and the profile of isolation between trenches 124 in the adjacent rows in the view of FIG. 12A. Therefore, the depth of oxide 188 in the view of FIG. 12A can be more shallow, or the width can be reduced to provide a higher memory packing density.

The invention is not limited to silicon, to particular P or N conductivity types, or other features described above. Some embodiments include memories manufactured using a silicon-on-insulator (SOI) substrate. A trench in the semiconductor substrate may terminate in the substrate or go through the substrate. Other substrates and materials, and other embodiments and variations are within the scope of the invention, as defined by the appended claims.

The invention claimed is:

1. A method for manufacturing an integrated circuit which comprises a memory having a conductive charge storage node at least partially located in a first trench in a semiconductor substrate, the memory comprising a transistor which comprises a first source/drain region in the semiconductor substrate, the first source/drain region being electrically coupled to the charge storage node, the first source/drain region being present at a first side of the first trench but not at a second side of the first trench, or being connected by a conductive path to the first side of the first trench but not to the second side of the first trench, the memory comprising an isolation region present at the second side of the first trench, the method comprising:
   (a) forming the first trench in the semiconductor substrate;
   (b) forming first material in the first trench in the isolation region and adjacent to a location of the first source/drain region or the conductive path;
   (c) forming a mask over the isolation region;
   (d) removing a first portion of the first material adjacent to the location of the first source/drain region or the conductive path while the mask protects the first material in the isolation region; and
   (e) forming conductive material in a region from which the first portion of the first material was removed, the conductive material providing at least a portion of the charge storage node adjacent to the location of the first source/drain region or the conductive path;
   (f) etching the semiconductor substrate adjacent to a third side of the first trench to form a second trench;
   (g) after operation (e), removing a second portion of the first material from the isolation region;
   (h) forming first dielectric in the isolation region at a former location of the second portion of the first material, and forming second dielectric in the second trench; and
   (i) forming said transistor;
   wherein the first dielectric reaches deeper into the semiconductor substrate than a top of said at least a portion of the charge storage node adjacent to the location of the first source/drain region or the conductive path;
   wherein the second trench reaches deeper into the semiconductor substrate than the first dielectric; and
   wherein the first dielectric and the second dielectric are formed at the same time.

2. The method of claim 1 wherein the charge storage node and the first source/drain region are part of a conductive path through the first side of the first trench.

3. The method of claim 1 wherein:
   the first trench has a substantially straight sidewall portion at the top of the first trench on the second side; and
   the substantially straight sidewall portion is not etched before forming the first material.

4. The method of claim 1 wherein:
   the memory comprises a memory array comprising a plurality of rows and a plurality of columns, wherein said charge storage node is one of a plurality of charge storage nodes formed in respective first trenches in the memory array in the semiconductor substrate, wherein said transistor is one of a plurality of transistors of the memory array, each transistor comprising a first source/drain region in the semiconductor substrate, each first source/drain region being electrically coupled to the respective charge storage node, each first source/drain region being present at a first side of the respective first trench but not at a second side of the respective first trench, or being connected by a conductive path to the first side of the respective first trench but not to the second side of the respective first trench, wherein the isolation region is one of a plurality of isolation regions present at the second sides of the first trenches;

wherein operation (a) comprises forming the first trenches in the semiconductor substrate;

wherein operation (b) comprises forming the first material in the first trenches in the isolation regions and adjacent to locations of the first source/drain regions or the conductive paths;

wherein operation (c) comprises forming the mask over the isolation regions;

wherein the first portion of the first material is one of a plurality of first portions of the first material which are adjacent to locations of the respective first source/drain regions or the conductive paths, and the second portion of the first material is one of a plurality of second portions of the first material which are present in the respective isolation regions;

wherein operation (d) comprises removing the first portions of the first material while the mask protects the first material in the isolation regions;

wherein operation (e) comprises forming the conductive material which provides at least portions of the charge storage nodes adjacent to the locations of the first source/drain regions or the conductive paths;

wherein operation (f) comprises etching the semiconductor substrate adjacent to a third side of each first trench to form one or more second trenches;

wherein operation (g) comprises removing the second portions of the first material after operation (e);

wherein operation (h) comprises forming the first dielectric in each isolation region at a former location of each second portion of the first material, and forming the second dielectric in each second trench;

wherein the first dielectric in each isolation region reaches deeper into the semiconductor substrate than a top of said at least a portion of each charge storage node adjacent to the location of the respective first source/drain region or the conductive path; and wherein each second trench reaches deeper into the semiconductor substrate than the first dielectric.

5. The method of claim 4 wherein at a conclusion of operation (d) the first material comprises a plurality of straight strips, each strip running through a plurality of the first trenches in a row direction.

6. The method of claim 4 wherein the mask comprises a plurality of straight strips each of which extends through a plurality of the trenches in a row direction.

7. The method of claim 4 wherein the second side of each of the first trenches faces the second side of another, adjacent one of the first trenches.

8. A method for manufacturing an integrated circuit which comprises a memory array having a plurality of rows and a plurality of columns, each row comprising a plurality of first trenches, the memory comprising a plurality of charge storage nodes each of which is at least partially located in a respective first trench, each first trench also containing an isolation region, each charge storage node being electrically coupled to a first source/drain region of an associated transistor, the method comprising:

(a) forming the first trenches in the semiconductor substrate;

(b) forming first material in each first trench in the respective isolation region and adjacent to a location of the respective first source/drain region or a respective conductive path connecting the first source/drain region to the trench;

(c) forming a mask over the isolation regions;

(d) removing first portions of the first material, each first portion of the first material being adjacent to the location of each first source/drain region or conductive path while the mask protects the first material in the isolation regions; and (e) forming conductive material in regions from which the first portions of the first material were removed, the conductive material providing at least a portion of each charge storage node adjacent to the location of the respective source/drain region or the conductive path;

(f) etching the semiconductor substrate between adjacent columns of the array to form one or more second trenches;

(g) after operation (e), removing a second portion of the first material from each isolation region;

(h) forming first dielectric in the isolations regions at former locations of the second portions of the first material, and forming second dielectric in the one or more second trenches; and (i) forming said transistors;

wherein the first dielectric reaches deeper into the semiconductor substrate than a top of each said at least a portion of the respective charge storage node adjacent to the location of the respective first source/drain region or conductive path;

wherein each second trench reaches deeper into the semiconductor substrate than the first dielectric; and wherein the first dielectric and the second dielectric are formed at the same time.

9. The method of claim 8 wherein each charge storage node and the associated first source/drain region are part of a conductive path through the first side of the first trench.

10. The method of claim 8 wherein in each row, the isolation region of each first trench faces an isolation region of an adjacent first trench.

* * * * *